(12) United States Patent
Wallis

(10) Patent No.: US 11,984,857 B2
(45) Date of Patent: May 14, 2024

(54) IMPEDANCE TRANSFORMATION CIRCUIT FOR AMPLIFIER

(71) Applicant: Skyworks Solutions, Inc., Irvine, CA (US)

(72) Inventor: Leslie Paul Wallis, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 433 days.

(21) Appl. No.: 17/144,952

(22) Filed: Jan. 8, 2021

(65) Prior Publication Data
US 2021/0211103 A1 Jul. 8, 2021

Related U.S. Application Data

(63) Continuation of application No. 16/263,884, filed on Jan. 31, 2019, now Pat. No. 10,892,718, which is a (Continued)

(51) Int. Cl.
*H03F 1/22* (2006.01)
*H03F 1/34* (2006.01)
(Continued)

(52) U.S. Cl.
CPC ............... *H03F 1/565* (2013.01); *H03F 1/22* (2013.01); *H03F 1/223* (2013.01); *H03F 1/34* (2013.01); *H03F 1/342* (2013.01); *H03F 1/347* (2013.01); *H03F 3/195* (2013.01); *H03F 3/213* (2013.01); *H03F 3/245* (2013.01); *H03F 3/72* (2013.01); *H04B 1/0475* (2013.01); *H04B 1/1607* (2013.01); *H03F 2200/18* (2013.01); (Continued)

(58) Field of Classification Search
CPC ..................................... H03F 1/22; H03F 9/00
USPC ................................. 330/165, 276, 311, 310
See application file for complete search history.

(56) References Cited

U.S. PATENT DOCUMENTS

| | | | |
|---|---|---|---|
| 2,293,414 | A | 8/1942 | Strutt et al. |
| 4,079,336 | A | 3/1978 | Gross |

(Continued)

FOREIGN PATENT DOCUMENTS

| | | |
|---|---|---|
| CN | 101401206 | 4/2009 |
| CN | 102237342 | 11/2011 |

(Continued)

OTHER PUBLICATIONS

Amkor, System in Package (SIP) Technology Solutions Data Sheet, Rev. Nov. 2015, 4 pages, available at: https://www.amkor.com/index.cfm?objectid=0638A98A-A85E-0A85-F5EF006A6CEEEC13 (accessed on May 24, 2017).

(Continued)

*Primary Examiner* — Henry Choe
(74) *Attorney, Agent, or Firm* — Knobbe, Martens, Olson & Bear, LLP

(57) ABSTRACT

Aspects of this disclosure relate to an impedance transformation circuit for use in an amplifier, such as a low noise amplifier. The impedance transformation circuit includes a matching circuit including a first inductor. The impedance transformation circuit also includes a second inductor. The first and second inductors are magnetically coupled to each other to provide negative feedback to linearize the amplifier.

20 Claims, 9 Drawing Sheets

Related U.S. Application Data continuation of application No. 15/788,454, filed on Oct. 19, 2017, now Pat. No. 10,230,337, which is a continuation of application No. 15/389,097, filed on Dec. 22, 2016, now Pat. No. 9,825,597.

(60) Provisional application No. 62/273,225, filed on Dec. 30, 2015.

(51) Int. Cl.
  *H03F 1/56* (2006.01)
  *H03F 3/195* (2006.01)
  *H03F 3/213* (2006.01)
  *H03F 3/24* (2006.01)
  *H03F 3/72* (2006.01)
  *H04B 1/04* (2006.01)
  *H04B 1/16* (2006.01)

(52) U.S. Cl.
  CPC .. *H03F 2200/294* (2013.01); *H03F 2200/387* (2013.01); *H03F 2200/451* (2013.01); *H03F 2200/75* (2013.01); *H04B 2001/0433* (2013.01)

(56) References Cited

U.S. PATENT DOCUMENTS

| | | | |
|---|---|---|---|
| 4,122,403 A | 10/1978 | Cave | |
| 4,159,450 A | 6/1979 | Hoover | |
| 4,821,005 A | 4/1989 | Kling | |
| 4,859,967 A | 8/1989 | Swanson | |
| 5,251,331 A | 10/1993 | Schwent et al. | |
| 5,438,684 A | 8/1995 | Schwent et al. | |
| 5,500,628 A | 3/1996 | Knecht | |
| 5,847,607 A | 12/1998 | Lewicki et al. | |
| 5,847,610 A | 12/1998 | Fujita | |
| 5,949,294 A | 9/1999 | Kondo et al. | |
| 6,064,249 A | 5/2000 | Duvvury et al. | |
| 6,188,277 B1 | 2/2001 | Borodulin et al. | |
| 6,229,249 B1 | 5/2001 | Hatanaka et al. | |
| 6,388,546 B1 | 5/2002 | Kikokawa et al. | |
| 6,388,623 B1 | 5/2002 | Sakota et al. | |
| 6,392,603 B1 | 5/2002 | Kurz et al. | |
| 6,417,817 B1 | 7/2002 | Pirilä et al. | |
| 6,472,598 B1 | 10/2002 | Glenn | |
| 6,549,077 B1 | 4/2003 | Jou | |
| 6,606,483 B1 | 8/2003 | Baker et al. | |
| 6,664,864 B2 | 12/2003 | Jiles et al. | |
| 6,686,649 B1 | 2/2004 | Mathews et al. | |
| 6,734,539 B2 | 5/2004 | Degani et al. | |
| 6,744,213 B2 | 6/2004 | Wilcoxson et al. | |
| 6,744,310 B2 | 6/2004 | Honda | |
| 6,850,196 B2 | 2/2005 | Wong et al. | |
| 6,861,731 B2 | 3/2005 | Buijsman et al. | |
| 6,873,211 B1 | 3/2005 | Thompson et al. | |
| 6,946,919 B2 | 9/2005 | Knecht et al. | |
| 6,977,552 B2 | 12/2005 | Macedo | |
| 6,991,947 B1 | 1/2006 | Gheewala | |
| 7,053,718 B2 | 5/2006 | Dupuis et al. | |
| 7,110,741 B2 | 9/2006 | Knopik et al. | |
| 7,123,197 B2 | 10/2006 | Suzuki | |
| 7,274,546 B2 | 9/2007 | Gauthier, Jr. et al. | |
| 7,348,854 B1 | 3/2008 | Mordkovich | |
| 7,352,247 B2 | 4/2008 | Oh et al. | |
| 7,378,780 B2 | 5/2008 | Mizumura et al. | |
| 7,409,192 B2 | 8/2008 | Lombardi et al. | |
| 7,425,873 B2 | 9/2008 | Yamamoto | |
| 7,477,197 B2 | 1/2009 | Zeng et al. | |
| 7,515,000 B1 | 4/2009 | Jin et al. | |
| 7,579,672 B2 | 8/2009 | Wu | |
| 7,593,204 B1 | 9/2009 | Iversen et al. | |
| 7,649,722 B2 | 1/2010 | Thijs et al. | |
| 7,679,452 B2 | 3/2010 | Perez | |
| 7,786,807 B1 | 8/2010 | Li et al. | |
| 7,881,029 B1 | 2/2011 | Li et al. | |
| 7,911,269 B2 | 3/2011 | Yang et al. | |
| 7,952,433 B2 | 5/2011 | An et al. | |
| 8,125,788 B2 | 2/2012 | Hatanaka et al. | |
| 8,131,251 B2 | 3/2012 | Burgener et al. | |
| 8,199,518 B1 | 6/2012 | Chun et al. | |
| 8,289,084 B2 | 10/2012 | Morimoto et al. | |
| 8,310,835 B2 | 11/2012 | Lin et al. | |
| 8,362,840 B2 | 1/2013 | Andrys et al. | |
| 8,410,990 B2 | 4/2013 | Kazanchian | |
| 8,456,856 B2 | 6/2013 | Lin et al. | |
| 8,554,162 B2 | 10/2013 | Lindstrand et al. | |
| 8,610,503 B2 | 12/2013 | Kaczman et al. | |
| 8,626,084 B2* | 1/2014 | Chan | H03H 11/30 455/280 |
| 8,686,796 B2 | 4/2014 | Presti | |
| 8,773,204 B2 | 7/2014 | Cabanillas et al. | |
| 8,803,615 B2 | 8/2014 | Cabanillas et al. | |
| 8,847,689 B2 | 9/2014 | Zhao et al. | |
| 8,912,959 B2 | 12/2014 | Chiu et al. | |
| 9,000,847 B2 | 4/2015 | Zhao et al. | |
| 9,019,010 B2 | 4/2015 | Costa | |
| 9,172,131 B2 | 10/2015 | Chen et al. | |
| 9,196,958 B2 | 11/2015 | Arnold et al. | |
| 9,219,445 B2 | 12/2015 | Nobbe et al. | |
| 9,225,303 B1 | 12/2015 | Nieland | |
| 9,343,817 B2 | 5/2016 | Pan | |
| 9,369,087 B2 | 6/2016 | Burgener et al. | |
| 9,595,926 B2 | 3/2017 | Quaglietta | |
| 9,660,609 B2 | 5/2017 | Reisner et al. | |
| 9,680,416 B2 | 6/2017 | Burgener et al. | |
| 9,691,710 B1 | 6/2017 | Deng et al. | |
| 9,743,522 B2 | 8/2017 | Li et al. | |
| 9,786,613 B2 | 10/2017 | Stauber | |
| 9,825,597 B2 | 11/2017 | Wallis | |
| 9,831,414 B2 | 11/2017 | Kojo | |
| 9,838,047 B2 | 12/2017 | Oliaei | |
| 9,871,007 B2 | 1/2018 | Meyers et al. | |
| 9,887,454 B2 | 2/2018 | Ito et al. | |
| 9,918,386 B2 | 3/2018 | Frenette et al. | |
| 9,923,261 B2 | 3/2018 | Jin et al. | |
| 10,062,670 B2 | 8/2018 | Frenette et al. | |
| 10,084,416 B2 | 9/2018 | Wallis | |
| 10,098,229 B2 | 10/2018 | Takagi et al. | |
| 10,110,168 B2 | 10/2018 | Soliman | |
| 10,110,468 B2 | 10/2018 | Farmanbar | |
| 10,171,053 B2 | 1/2019 | Soliman | |
| 10,211,795 B2 | 2/2019 | Wallis | |
| 10,230,337 B2 | 3/2019 | Wallis | |
| 10,231,341 B2 | 3/2019 | Frenette et al. | |
| 10,256,535 B2 | 4/2019 | Nguyen et al. | |
| 10,269,769 B2 | 4/2019 | Frenette et al. | |
| 10,276,521 B2 | 4/2019 | Babcock et al. | |
| 10,283,859 B2 | 5/2019 | Nguyen et al. | |
| 10,297,576 B2 | 5/2019 | Frenette et al. | |
| 10,297,913 B2 | 5/2019 | Khoury | |
| 10,320,058 B2 | 6/2019 | Hsu et al. | |
| 10,320,071 B2 | 6/2019 | Nguyen et al. | |
| 10,362,678 B2 | 7/2019 | Frenette et al. | |
| 10,446,524 B2 | 10/2019 | Frenette et al. | |
| 10,454,432 B2 | 10/2019 | Soliman | |
| 10,505,255 B2 | 12/2019 | Baheti et al. | |
| 10,515,924 B2 | 12/2019 | Babcock et al. | |
| 10,530,050 B2 | 1/2020 | Nguyen et al. | |
| 10,535,637 B2 | 1/2020 | Frenette et al. | |
| 10,548,223 B2 | 1/2020 | Frenette et al. | |
| 10,629,553 B2 | 4/2020 | Soliman et al. | |
| 10,651,798 B2 | 5/2020 | Soliman | |
| 10,665,936 B2 | 5/2020 | Mikata et al. | |
| 10,666,205 B2 | 5/2020 | Wallis | |
| 10,770,452 B2 | 9/2020 | Wallis | |
| 10,879,604 B2 | 12/2020 | Zhang et al. | |
| 10,892,718 B2 | 1/2021 | Wallis | |
| 10,931,009 B2 | 2/2021 | Nguyen et al. | |
| 10,957,973 B2 | 3/2021 | Ariumi | |
| 11,037,893 B2 | 6/2021 | Wallis et al. | |
| 11,038,266 B2 | 6/2021 | Khoury | |
| 11,043,466 B2 | 6/2021 | Babcock et al. | |
| 11,049,824 B2 | 6/2021 | Franson et al. | |
| 11,069,952 B2 | 7/2021 | Keller, III | |

(56) References Cited

U.S. PATENT DOCUMENTS

| | | |
|---|---|---|
| 11,082,008 B2 | 8/2021 | Soliman |
| 11,088,112 B2 | 8/2021 | Frenette et al. |
| 11,223,116 B2 | 1/2022 | Lasiter et al. |
| 11,380,979 B2 | 7/2022 | Dalmia et al. |
| 11,451,195 B2 * | 9/2022 | Tabei .................. H03F 1/223 |
| 11,552,393 B2 | 1/2023 | Khoury |
| 11,576,248 B2 | 2/2023 | Wallis et al. |
| 11,682,649 B2 | 6/2023 | Babcock et al. |
| 11,864,295 B2 | 1/2024 | Soliman et al. |
| 2002/0053947 A1 | 5/2002 | Macedo |
| 2002/0067205 A1 | 6/2002 | Aparin et al. |
| 2002/0153570 A1 | 10/2002 | Lin et al. |
| 2004/0207021 A1 | 10/2004 | Russ et al. |
| 2004/0238857 A1 | 12/2004 | Beroz et al. |
| 2004/0252064 A1 | 12/2004 | Yuanzhu |
| 2005/0045729 A1 | 3/2005 | Yamazaki |
| 2005/0078038 A1 | 4/2005 | Takaki et al. |
| 2005/0122644 A1 | 6/2005 | Ma et al. |
| 2005/0184626 A1 | 8/2005 | Chiba et al. |
| 2005/0269659 A1 | 12/2005 | Huang |
| 2005/0272399 A1 | 12/2005 | Murata |
| 2006/0006950 A1 | 1/2006 | Burns et al. |
| 2006/0245308 A1 | 11/2006 | Macroupoulos et al. |
| 2007/0010300 A1 | 1/2007 | Xue et al. |
| 2007/0046376 A1 | 3/2007 | Heijden |
| 2007/0070564 A1 | 3/2007 | Ma et al. |
| 2007/0075693 A1 | 4/2007 | Xi |
| 2007/0109697 A1 | 5/2007 | Huh |
| 2007/0138629 A1 | 6/2007 | Lam |
| 2007/0164907 A1 | 7/2007 | Gaucher et al. |
| 2007/0273445 A1 | 11/2007 | Sarkar |
| 2008/0024213 A1 | 1/2008 | Magrath |
| 2008/0030282 A1 | 2/2008 | Maget et al. |
| 2008/0061419 A1 | 3/2008 | Enquist et al. |
| 2008/0084677 A1 | 4/2008 | Ho et al. |
| 2008/0158063 A1 | 7/2008 | Zeng et al. |
| 2008/0232010 A1 | 9/2008 | Wang et al. |
| 2008/0239597 A1 | 10/2008 | Van Bezooijen et al. |
| 2008/0239599 A1 | 10/2008 | Yizraeli et al. |
| 2008/0291115 A1 | 11/2008 | Doan et al. |
| 2009/0027741 A1 | 1/2009 | Quah et al. |
| 2009/0091904 A1 | 4/2009 | Hatanaka et al. |
| 2009/0108431 A1 | 4/2009 | Farley |
| 2009/0163159 A1 | 6/2009 | Ooi |
| 2009/0267220 A1 | 10/2009 | Kuhlman et al. |
| 2009/0295645 A1 | 12/2009 | Campero et al. |
| 2010/0103058 A1 | 4/2010 | Kato et al. |
| 2010/0117750 A1 | 5/2010 | Fry et al. |
| 2010/0158084 A1 | 6/2010 | Voinigescu et al. |
| 2010/0202126 A1 | 8/2010 | Nakamura et al. |
| 2010/0233975 A1 | 9/2010 | Wu |
| 2010/0237947 A1 | 9/2010 | Xiong et al. |
| 2011/0003571 A1 | 1/2011 | Park et al. |
| 2011/0018635 A1 | 1/2011 | Tasic et al. |
| 2011/0042798 A1 | 2/2011 | Pagaila et al. |
| 2011/0043284 A1 | 2/2011 | Zhao et al. |
| 2011/0076979 A1 | 3/2011 | Wu et al. |
| 2011/0084378 A1 | 4/2011 | Welch et al. |
| 2011/0175789 A1 | 7/2011 | Lee et al. |
| 2011/0273360 A1 | 11/2011 | Campero |
| 2011/0291765 A1 | 12/2011 | Sun et al. |
| 2011/0292554 A1 | 12/2011 | Yao et al. |
| 2012/0049894 A1 | 3/2012 | Berchtold et al. |
| 2012/0062286 A1 | 3/2012 | Ginsburg et al. |
| 2012/0062325 A1 | 3/2012 | Kim et al. |
| 2012/0074990 A1 | 3/2012 | Sornin |
| 2012/0079468 A1 | 3/2012 | Gringauze et al. |
| 2012/0092220 A1 | 4/2012 | Tani et al. |
| 2012/0224407 A1 | 9/2012 | Aleksic et al. |
| 2012/0262239 A1 | 10/2012 | Taghivand et al. |
| 2012/0274409 A1 | 11/2012 | Eldesouki et al. |
| 2012/0313821 A1 | 12/2012 | Fischer |
| 2013/0009704 A1 | 1/2013 | Liao |
| 2013/0056882 A1 | 3/2013 | Kim et al. |
| 2013/0084915 A1 | 4/2013 | Asuri et al. |
| 2013/0093629 A1 | 4/2013 | Chiu et al. |
| 2013/0100616 A1 | 4/2013 | Zohni et al. |
| 2013/0162362 A1 | 6/2013 | Harima |
| 2013/0241662 A1 | 9/2013 | Aleksic et al. |
| 2013/0331043 A1 | 12/2013 | Perumana et al. |
| 2013/0334321 A1 | 12/2013 | Kato et al. |
| 2013/0342022 A1 | 12/2013 | Browning et al. |
| 2013/0343022 A1 | 12/2013 | Hu et al. |
| 2014/0003000 A1 | 1/2014 | McPartlin |
| 2014/0009204 A1 | 1/2014 | Cebi et al. |
| 2014/0015614 A1 | 1/2014 | Oliveira et al. |
| 2014/0023012 A1 | 1/2014 | Sato |
| 2014/0042607 A1 | 2/2014 | Knickerbocker |
| 2014/0043105 A1 | 2/2014 | Zerbe et al. |
| 2014/0062607 A1 | 3/2014 | Nair et al. |
| 2014/0071566 A1 | 3/2014 | Parthasarathy et al. |
| 2014/0085760 A1 | 3/2014 | Lui |
| 2014/0104010 A1 | 4/2014 | Chen et al. |
| 2014/0124956 A1 | 5/2014 | Lee |
| 2014/0148434 A1 | 5/2014 | Boyall et al. |
| 2014/0151105 A1 | 6/2014 | Kuwahara |
| 2014/0167232 A1 | 6/2014 | LoBianco et al. |
| 2014/0175621 A1 | 6/2014 | Chen et al. |
| 2014/0179239 A1 | 6/2014 | Nickel et al. |
| 2014/0184334 A1 | 7/2014 | Nobbe et al. |
| 2014/0225795 A1 | 8/2014 | Yu |
| 2014/0232477 A1 | 8/2014 | Park et al. |
| 2014/0252595 A1 | 9/2014 | Yen et al. |
| 2014/0253242 A1 | 9/2014 | Youssef et al. |
| 2014/0253382 A1 | 9/2014 | Markish et al. |
| 2014/0256271 A1 | 9/2014 | Kok |
| 2014/0266461 A1 | 9/2014 | Youssef et al. |
| 2014/0266480 A1 | 9/2014 | Li et al. |
| 2014/0308907 A1 | 10/2014 | Chen |
| 2014/0348274 A1 | 11/2014 | Youssef et al. |
| 2015/0015339 A1 | 1/2015 | Gorbachov et al. |
| 2015/0015863 A1 | 1/2015 | Kempen et al. |
| 2015/0035600 A1 | 2/2015 | Jin et al. |
| 2015/0056940 A1 | 2/2015 | Rangarajan et al. |
| 2015/0061770 A1 | 3/2015 | Luo et al. |
| 2015/0091658 A1 | 4/2015 | Shima et al. |
| 2015/0097031 A1 | 4/2015 | Yang et al. |
| 2015/0097629 A1 | 4/2015 | Chong |
| 2015/0155831 A1 | 6/2015 | Shirvani |
| 2015/0162877 A1 | 6/2015 | Ni |
| 2015/0222012 A1 | 8/2015 | Van Zeijl et al. |
| 2015/0249051 A1 | 9/2015 | Tsai et al. |
| 2015/0263421 A1 | 9/2015 | Chiu et al. |
| 2015/0270806 A1 | 9/2015 | Wagh et al. |
| 2015/0270943 A1 | 9/2015 | Liu et al. |
| 2015/0303806 A1 * | 10/2015 | Madsen .............. H02M 3/1563 323/271 |
| 2015/0310994 A1 | 10/2015 | Yosui |
| 2015/0333760 A1 | 11/2015 | Zerbe et al. |
| 2015/0340992 A1 | 11/2015 | Korol et al. |
| 2015/0364214 A1 | 12/2015 | Li |
| 2015/0364429 A1 | 12/2015 | Lee et al. |
| 2016/0013638 A1 | 1/2016 | Glas et al. |
| 2016/0064337 A1 | 3/2016 | Chen et al. |
| 2016/0079854 A1 | 3/2016 | Kinzer et al. |
| 2016/0079993 A1 | 3/2016 | Zerbe et al. |
| 2016/0087593 A1 | 3/2016 | Nobbe et al. |
| 2016/0094192 A1 | 3/2016 | Khesbak et al. |
| 2016/0099720 A1 | 4/2016 | Bashir et al. |
| 2016/0112054 A1 | 4/2016 | Gonzalez et al. |
| 2016/0128179 A1 | 5/2016 | Okamoto et al. |
| 2016/0149300 A1 | 5/2016 | Ito et al. |
| 2016/0164476 A1 | 6/2016 | Wang |
| 2016/0172845 A1 | 6/2016 | Parris et al. |
| 2016/0226496 A1 | 8/2016 | Aleksic et al. |
| 2016/0337117 A1 | 11/2016 | Liu et al. |
| 2016/0365994 A1 | 12/2016 | Chen et al. |
| 2017/0040941 A1 | 2/2017 | Chatwin |
| 2017/0117907 A1 | 4/2017 | Grollitsch |
| 2017/0163223 A1 | 6/2017 | Shimamoto |
| 2017/0194317 A1 | 7/2017 | Wallis |
| 2017/0194918 A1 | 7/2017 | Wallis |
| 2017/0201291 A1 | 7/2017 | Gu et al. |
| 2017/0207791 A1 | 7/2017 | Zerbe et al. |

(56) References Cited

U.S. PATENT DOCUMENTS

| | | |
|---|---|---|
| 2017/0232345 A1 | 8/2017 | Rofougaran et al. |
| 2017/0237181 A1 | 8/2017 | Chen et al. |
| 2017/0278816 A1 | 9/2017 | Li et al. |
| 2017/0278840 A1 | 9/2017 | Robbins et al. |
| 2017/0279415 A1 | 9/2017 | Wallis |
| 2017/0280392 A1 | 9/2017 | Segev et al. |
| 2017/0288609 A1 | 10/2017 | Soliman |
| 2017/0290011 A1 | 10/2017 | Kushnir et al. |
| 2017/0301630 A1 | 10/2017 | Nguyen et al. |
| 2017/0301653 A1 | 10/2017 | Frenette et al. |
| 2017/0301654 A1 | 10/2017 | Frenette et al. |
| 2017/0301655 A1 | 10/2017 | Frenette et al. |
| 2017/0301985 A1 | 10/2017 | Nguyen et al. |
| 2017/0301986 A1 | 10/2017 | Nguyen et al. |
| 2017/0302224 A1 | 10/2017 | Frenette et al. |
| 2017/0302325 A1 | 10/2017 | Frenette et al. |
| 2017/0303400 A1 | 10/2017 | Frenette et al. |
| 2017/0324160 A1 | 11/2017 | Khoury |
| 2017/0324388 A1 | 11/2017 | Soliman |
| 2018/0026592 A1 | 1/2018 | Wallis |
| 2018/0138872 A1 | 5/2018 | Wallis |
| 2018/0219516 A1 | 8/2018 | Soliman |
| 2018/0226367 A1 | 8/2018 | Babcock et al. |
| 2018/0255643 A1 | 9/2018 | Frenette et al. |
| 2018/0286840 A1 | 10/2018 | Nair et al. |
| 2018/0323752 A1 | 11/2018 | Wallis |
| 2019/0007002 A1 | 1/2019 | Wallis |
| 2019/0043837 A1 | 2/2019 | Frenette et al. |
| 2019/0097594 A1 | 3/2019 | Soliman |
| 2019/0103365 A1 | 4/2019 | Singh et al. |
| 2019/0181809 A1 | 6/2019 | Wallis |
| 2019/0181815 A1 | 6/2019 | Wallis |
| 2019/0198990 A1 | 6/2019 | Nguyen et al. |
| 2019/0214354 A1 | 7/2019 | Soliman et al. |
| 2019/0223079 A1 | 7/2019 | Frenette et al. |
| 2019/0230794 A1 | 7/2019 | Frenette et al. |
| 2019/0237433 A1 | 8/2019 | Frenette et al. |
| 2019/0334237 A1 | 10/2019 | Khoury |
| 2019/0341687 A1 | 11/2019 | Nguyen et al. |
| 2019/0343000 A1 | 11/2019 | Frenette |
| 2020/0058619 A1 | 2/2020 | Frenette et al. |
| 2020/0106403 A1 | 4/2020 | Soliman |
| 2020/0279825 A1 | 9/2020 | Babcock et al. |
| 2020/0336107 A1 | 10/2020 | Soliman |
| 2020/0357756 A1 | 11/2020 | Wallis et al. |
| 2021/0143542 A1 | 5/2021 | Nguyen et al. |
| 2021/0217713 A1 | 7/2021 | Wallis et al. |
| 2021/0217714 A1 | 7/2021 | Soliman et al. |
| 2021/0273326 A1 | 9/2021 | Khoury |
| 2021/0320081 A1 | 10/2021 | Babcock et al. |
| 2023/0111462 A1 | 4/2023 | Khoury |
| 2023/0126116 A1* | 4/2023 | Husain ............... H03F 1/223 330/250 |

FOREIGN PATENT DOCUMENTS

| | | |
|---|---|---|
| CN | 102469051 | 5/2012 |
| CN | 102577110 | 7/2012 |
| CN | 103050482 | 4/2013 |
| CN | 103247581 | 8/2013 |
| CN | 104936395 | 9/2015 |
| CN | 105409060 | 3/2016 |
| CN | 105409116 | 3/2016 |
| CN | 105515542 | 4/2016 |
| CN | 102884724 | 5/2016 |
| CN | 103748785 | 7/2017 |
| JP | 2008-054260 | 3/2008 |
| JP | 2009-027741 | 2/2009 |
| JP | 2012-079468 | 4/2012 |
| JP | 2013-179152 | 9/2013 |
| JP | 2014-023012 | 2/2014 |
| JP | 2014-178731 | 9/2014 |
| KR | 10-2005-0084978 | 8/2005 |
| KR | 10-2010-0059724 | 6/2010 |
| KR | 10-2010-062316 | 6/2010 |
| KR | 10-2015-0028844 | 5/2015 |
| KR | 10-2012-0133119 | 5/2018 |
| TW | 577191 | 2/2004 |
| TW | 2009-10757 | 3/2009 |
| TW | 201517506 | 5/2015 |
| TW | 201603477 | 1/2016 |
| TW | I528736 | 4/2016 |
| WO | WO 2015/015863 | 2/2015 |
| WO | WO 2016/189199 | 12/2016 |
| WO | WO 2017/184654 | 10/2017 |

OTHER PUBLICATIONS

Campbell, E., Bluetooth Radio Design Considerations for Cellular Handset Application, RF Globalnet, Apr. 3, 2001, 13 pages.
Chip Design, Tools, Technologies & Methodologies, "Coordinating from Silicon to Package", Mar. 17, 2008, 11 pages.
EM358x High-Performance, Integrated ZigBee/802.15.4 System-on-Chip Family, Apr. 2014, by Silicon Laboratories, located at https://www.silabs.com/documents/public/data-sheets/EM358x.pdf.
Brown, et al., Trends in RF/Wireless Packaging An Overview, 2004, 98 pages, available at: http://www.iwpc.org/Presentations/IWPC_Trends_Packaging_Final_slides_MTT_S_2004.pdf (accessed on May 3, 2017).
Esswein et al., "An improved switched injection-locked oscillator for ranging and communications systems" Proceedings of the 43rd European Microwave Conference 2013 in 4 pages.
Insight SiP, "Application Note AN160601 Use of ISP 1507 Development Kit," Oct. 27, 2016, available at: http://www.insightsip.com/fichiers_insightsip/pdf/ble/ISP1507/isp_ble_AN160601.pdf (accessed: Jul. 24, 2017).
Insight SiP, "ISP 1507 High Performance Bluetooth 5 Ready, NFC & ANT Low Energy Module with MCU & Antenna," Jan. 16, 2017, available at: http://www.insightsip.com/fichiers_insightsip/pdf/ble/ISP1507/isp_ble_DS1507.pdf (accessed: Jul. 24, 2017).
Kim, et al., "Bounded skew clock routing for 3D stacked IC designs: Enabling trade-offs between power and clock skew," International Conference on Green Computing, Chicago, IL, Aug. 2010, 2 pages.
Murata Electronics, "SN8000/SN800UFL Wi-Fi Module: Data Sheet," Version 1.0, Nov. 25, 2013, available at: http://www.mouser.com/pdfdocs/sn80008000ufl_ds_112513.PDF (accessed: Jul. 24, 2017).
Murata Electronics, "SN820X Wi-Fi Network Controller Module Family: User Manual," Version 2.2, Mar. 3, 2014, available at: http://www.mouser.com/pdfdocs/sn820x_manual_030314.PDF (accessed: Jul. 24, 2017).
Murata Electronics, "Bluetooth Low Energy Module Data Sheet," Rev. J, Feb. 27, 2015, available at: http://wireless.murata.com/eng/products/rf-modules-1/bluetooth/type-zy.html PDF (accessed: Jul. 24, 2017).
Qualcomm, 3D VLSI: Next Generation #D Integration Technology, 2015, 60 pages.
SESUB modules for smartphones: Very small and extremely flat, TDK Europe, EPCOS, Nov. 2012, 3 pages.
Stoukatch, et al.: "3D-SIP integration for autonomous sensor nodes," 56th Electronic Components and Technology Conference 2006, San Diego, CA, 2006, 2 pages.
Törmänen et al. "A 13dBm 60GHz-Band Injection Locked PA with 36% PAE in 65nm CMOS" Electrical and Information Technology, Lund University, Proceedings of the Asia-Pacific Microwave Conference 2011, 4 pages.
Weerasekera et al., "Extending systems-on-chip to the third dimension: Performance, cost and technological tradeoffs," IEEE/ACM International Conference on Computer-Aided Design, Digest of Technical Papers, ICCAD. 212-219. 10.1109/ICCAD.2007.4397268. Dec. 2007, 9 pages.
International Search Report of Aug. 18, 2017 for International Application No. PCT/US2017/028209 filed Apr. 18, 2017, 3 pages.
Written Opinion of Aug. 18, 2017 for International Application No. PCT/US2017/028209 filed Apr. 18, 2017, 16 pages.
International Search Report for International Application No. PCT/US2016/068712, dated Mar. 20, 2017, in 3 pages.

(56) References Cited

OTHER PUBLICATIONS

Written Opinion of the International Searching Authority for International Application No. PCT/US2016/068712, dated Mar. 20, 2017, in 8 pages.
International Search Report for International Application No. PCT/US2017/025091, dated Mar. 30, 2017, in 3 pages.
PCT Written Opinion of the International Searching Authority for International Application No. PCT/US2017/025091, dated Mar. 30, 2017, in 7 pages.
International Preliminary Report on Patentability for PCT Application No. PCT/US2017/028209, dated Oct. 23, 2018, in 17 pages.
Wikipedia contributors, "Common source," *Wikipedia, The Free Encyclopedia. Wikipedia,* https://en.wikipedia.org/wiki/Common_source (accessed: Jun. 28, 2017).
Wikipedia contributors, "Common emitter," *Wikipedia, The Free Encyclopedia. Wikipedia,* https://en.wikipedia.org/wiki/Common_emitter (accessed: Jun. 28, 2017).

\* cited by examiner

US 11,984,857 B2

IMPEDANCE TRANSFORMATION CIRCUIT FOR AMPLIFIER

CROSS-REFERENCE TO RELATED APPLICATION

Any and all applications for which a foreign or domestic priority claim is identified in the Application Data Sheet, or any correction thereto, are hereby incorporated by reference under 37 CFR 1.57.

BACKGROUND

Technical Field

Embodiments of this disclosure relate to electronic systems and, in particular, to impedance transformation circuits for amplifiers.

Description of Related Technology

A low noise amplifier (LNA) can receive a radio frequency (RF) signal from an antenna. The LNA can be used to boost the amplitude of a relatively weak RF signal. Thereafter, the boosted RF signal can be used for a variety of purposes, including, for example, driving a switch, a mixer, and/or a filter in an RF system.

LNAs can be included in a variety of applications, such as base stations or mobile devices, to amplify signals of a relatively wide range of frequencies. For example, a low noise amplifier (LNA) can be used to provide low noise amplification to RF signals in a frequency range of about 30 kHz to 300 GHz.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an impedance transformation circuit for use in an amplifier. The impedance transformation circuit includes a matching circuit including a first inductor. The impedance transformation circuit also includes a second inductor. The first and second inductors are magnetically coupled to each other to provide negative feedback to linearize the amplifier.

The second inductor can be configured as a degeneration inductor. For instance, the second inductor can be configured as a source degeneration inductor. Alternatively, the second inductor can be configured as an emitter degeneration inductor.

The first inductor can provide a radio frequency signal to an amplification circuit of the amplifier. The first inductor, the second inductor, and the amplification circuit of amplifier can be embodied on a single die.

The matching circuit can include a series inductor having a first end and a second end, in which the first end is configured to receive a radio frequency signal and the second end is electrically coupled to the first inductor. The matching circuit can include a shunt capacitor electrically coupled to the first end of the series inductor. Alternatively or additionally, the matching circuit can include a direct current blocking capacitor configured to provide the radio frequency signal to the series inductor.

Another aspect of this disclosure is a low noise amplifier (LNA) that includes a matching circuit including a first inductor, an amplification circuit, and a second inductor. The amplification circuit is configured to receive a radio frequency signal by way of the first inductor and to amplify the radio frequency signal. The first and second inductors are magnetically coupled to each other to provide negative feedback to linearize the LNA.

The amplification circuit can include a common source amplifier and the second inductor can be a source degeneration inductor. The amplification circuit can include a cascode field effect transistor having a source electrically connected to a drain of the common source amplifier.

The amplification circuit can include a common emitter amplifier and the second inductor can be an emitter degeneration inductor. The amplification circuit can include a cascode bipolar transistor having an emitter electrically connected to a collector of the common emitter amplifier.

The first inductor, the second inductor, and the amplification circuit of amplifier can be embodied on a single die.

The matching circuit can include a series inductor having a first end and a second end, in which the first end is configured to receive the radio frequency signal and the second end is electrically coupled to the first inductor. The matching circuit can further include a shunt capacitor electrically coupled to the first end of the series inductor. The matching circuit can include a direct current blocking capacitor configured to provide the radio frequency signal to the series inductor.

Another aspect of this disclosure is a front end system that includes a low noise amplifier and a bypass path. The low noise amplifier includes a matching circuit including a first inductor, an amplification circuit configured to receive a radio frequency signal by way of the first inductor and to amplify the radio frequency signal, and a second inductor magnetically coupled with the first inductor to provide negative feedback to linearize the low noise amplifier.

The front end system can include a multi-throw switch having at least a first throw electrically connected to the low noise amplifier and a second throw electrically connected to the bypass path. The low noise amplifier, the multi-throw switch, and the bypass path can be embodied on a single die. The multi-throw can electrically connect an input of the low noise amplifier to an antenna port in a first state, and the multi-throw switch can electrically connect the bypass path to the antenna port in a second state.

The multi-throw switch can include a third throw. The front end system can include a power amplifier, in which the third throw of the multi-throw switch is electrically coupled to the power amplifier. The low noise amplifier, the bypass path, the multi-throw switch, and the power amplifier can be embodied on a single die. The front end system can include a second multi-throw switch having at least a first throw electrically connected to the low noise amplifier and a second throw electrically connected to the bypass path. The low noise amplifier can be included in a first signal path between the multi-throw switch and the second multi-throw switch, and the bypass path can be included in a second signal path between the multi-throw switch and the second multi-throw switch.

The front end system can include an antenna.

The front end system can include one or more suitable features of the impedance transformation circuits and/or the low noise amplifiers discussed herein.

The amplification circuit can include a common source amplifier and the second inductor can be a source degeneration inductor. The amplification circuit can include a cascode field effect transistor having a source electrically connected to a drain of the common source amplifier.

The amplification circuit can include a common emitter amplifier and the second inductor can be an emitter degeneration inductor. The amplification circuit can include a cascode bipolar transistor having an emitter electrically connected to a collector of the common emitter amplifier.

The matching circuit can include a series inductor having a first end and a second end, in which the first end is configured to receive the radio frequency signal and the second end electrically coupled to the first inductor. The matching circuit can include a shunt capacitor electrically coupled to the first end of the series inductor. The matching circuit can include a direct current blocking capacitor configured to provide the radio frequency signal to the series inductor.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
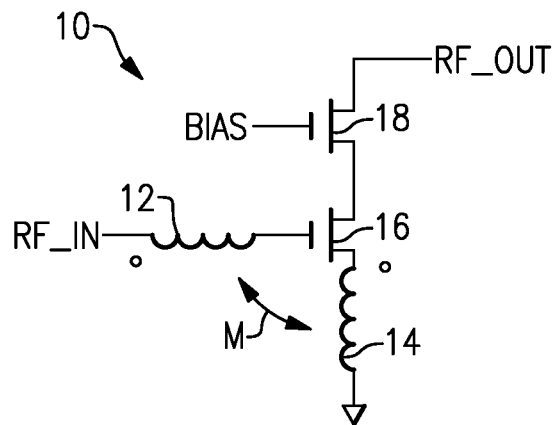
FIG. 1A is a schematic diagram of a low noise amplifier that includes field effect transistors and an impedance transformation circuit according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

There are several performance parameters for any given amplifier design to satisfy simultaneously. Supply current for an amplifier is often pre-determined. In such circumstances, there are relatively few variables that can be manipulated to set the overall behavior of the circuit. This disclosure provides one more controlling variable to set the overall performance of the circuit. In particular, linearity can be improved by implementing features of this disclosure.

In a low noise amplifier (LNA), linearity can be a significant parameter. It can be desirable for an LNA to have a relatively high linearity. Linearity can be measured by a 1 dB compression point and/or a 3rd order intermodulation. Accordingly, a 1 dB compression point and/or a 3rd order intermodulation of an LNA can be significant. Specifications for LNAs and other circuits are specifying higher linearity with lower supply current. This trend is expected to continue. Such specifications can be challenging to meet while also meeting other performance specifications. Accordingly, there is a need for LNAs with improved linearity.

This disclosure provides a new way to control the input match of an LNA, and in such a way the linearity of the LNA can be improved. For instance, using the principles and advantages discussed herein, the 1 dB compression point and 3rd order intermodulation can be improved. This disclosure provides circuits that can extend inductively degenerated amplifier concepts such that both self and mutual inductance effects can improve linearity of an LNA, instead of only self-inductive degeneration.

An LNA can include an inductively degenerated common source or common emitter amplifying device. The inductive degeneration can linearize such a circuit. In addition, the degeneration inductor can set the input impedance of the circuit in conjunction with the size and bias current of the amplifying device. A series input matching inductor at the input can be included to achieve a desired input impedance and obtain a relatively good input match.

Aspects of this disclosure relate to an LNA with magnetic coupling between a degeneration inductor (e.g., a source degeneration inductor or an emitter degeneration inductor) and a series input inductor. These magnetically coupled inductors can in effect provide a transformer, with a primary winding in series with the input and a secondary winding electrically connected where the degeneration inductor is electrically connected to the amplifying device (e.g., at the source of a field effect transistor amplifying device or at the emitter of a bipolar transistor amplifying device). The phase of the magnetic coupling can be significant. This phase is indicated by the dot notation in the accompanying drawings. With the magnetically coupled inductors disclosed herein, inductively degenerated amplifier concepts can be extended by using both self and mutual inductance.

In the LNAs discussed herein, several effects can occur at the same time. Typically, metal oxide semiconductor (MOS) LNAs have a voltage gain from the input of the circuit to a gate of the amplifying device. This voltage gain can degrade the 3rd order intermodulation (IIP3) performance of the circuit. An attenuator is typically not used to reduce signal amplitude because such an attenuator can undesirably degrade the noise performance of the circuit. The LNAs discussed herein can include a negative feedback circuit. An amplifying device of an LNA can receive a radio frequency (RF) signal by way of a first inductor that is magnetically coupled to a degeneration inductor. The first inductor can have a first end configured to receive the RF signal and a second end electrically coupled to the amplifying device. The impedance looking into a node at the first end of the first inductor (e.g., node n2 in FIGS. 2A to 2F) can be increased and the voltage at a node at the second end of the first inductor (e.g., node n3 in FIGS. 2A to 2F) can be decreased. This may not reduce the gain, but the effect can allow the circuit to be scaled differently, with a larger amplifying device. The higher input impedance can also allow the inductance of the input match inductor that provides the RF signal to the first inductor to have a lower value. This can be advantageous when an on chip match inductor is implemented, as the Q of such devices can be limited, and the effective series impedance of the input matching inductor can degrade the noise performance of the LNA. For instance, in one implementation, the input match inductor value is approximately half the value it would otherwise be without the magnetically coupled inductors. While the circuits discussed herein may not give the absolutely best possible noise match, the magnetically coupled inductors can allow the input match inductor to have a lower inductance and thereby recover at least some of the noise performance. The negative feedback provided by magnetically coupled inductors discussed herein can provide an amplifier with increased linearity.

One aspect of this disclosure is an impedance transformation circuit for use in an amplifier. The impedance transformation circuit includes a matching circuit including a first inductor. The impedance transformation circuit also includes a second inductor. The first and second inductors are magnetically coupled to each other to provide negative feedback to linearize the amplifier.

The second inductor can be a degeneration inductor, such as a source degeneration inductor or an emitter degeneration inductor. The first inductor can provide a radio frequency signal to an amplification circuit of the amplifier. The first inductor, the second inductor, and the amplification circuit of amplifier can be embodied on a single die.

The matching circuit can further include a series inductor having a first end and a second end, in which the first end is configured to receive a radio frequency signal and the second end is electrically coupled to the first inductor. The matching circuit can further include a shunt capacitor electrically coupled to the first end of the series inductor and/or a direct current (DC) blocking capacitor configured to provide the radio frequency signal to the series inductor.

Another aspect of this disclosure is a low noise amplifier (LNA). The LNA includes a matching circuit including a first inductor, an amplification circuit configured to receive a radio frequency signal by way of the first inductor and to amplify the radio frequency signal, and a second inductor. The first and second inductors are magnetically coupled to each other to provide negative feedback to linearize the LNA.

The amplification circuit can include a common source amplifier or a common emitter amplifier. A cascode transistor can be arranged in series with either of these amplifiers. Such a cascode transistor can be a common drain amplifier or a common base amplifier. The second inductor can be a source degeneration inductor or an emitter degeneration inductor.

The first inductor, the second inductor, and the amplification circuit of amplifier are can be embodied on a single die. The matching circuit can further include a series inductor having a first end and a second end, in which the first end is configured to receive the radio frequency signal and the second end is electrically coupled to the first inductor. The matching circuit can further include a shunt capacitor electrically coupled to the first end of the series inductor and/or a direct current (DC) blocking capacitor configured to provide the radio frequency signal to the series inductor.

Another aspect of this disclosure is a front end system that includes a low noise amplifier, a bypass path, and a multi-throw switch. The low noise amplifier includes a matching circuit including a first inductor, an amplification circuit configured to receive a radio frequency signal by way of the first inductor and to amplify the radio frequency signal, and a second inductor magnetically coupled with the first inductor to provide negative feedback to linearize the amplification circuit. The multi-throw switch has at least a first throw electrically connected to the low noise amplifier and a second throw electrically connected to the bypass path.

The front end system can further include a power amplifier. The multi-throw switch can have a third throw electrically coupled to the power amplifier. The low noise amplifier, the bypass path, the multi-throw switch, and the power amplifier can be embodied on a single die.

The front end system can further include a second multi-throw switch having at least a first throw electrically connected to the low noise amplifier and a second throw electrically connected to the bypass path, in which the low noise amplifier is included in a first signal path between the multi-throw switch and the second multi-throw switch, and in which the bypass path is included in a second signal path between the multi-throw switch and the second multi-throw switch.

The multi-throw switch can electrically connect an input of the low noise amplifier to an antenna in a first state, and the multi-throw switch can electrically connect the bypass path to the antenna in a second state. The front end system can further include the antenna. The antenna can be integrated with the low noise amplifier, the bypass path, and the multi-throw switch.

The low noise amplifier, the multi-throw switch, and the bypass path can be embodied on a single die. The front end system can include a package enclosing the low noise amplifier, the multi-throw switch, and the bypass path.

In the front end system, the LNA can include any suitable combination of features of the LNAs and/or amplifiers discussed herein.

FIGS. 1A to 1D illustrate example low noise amplifier that include impedance transformation circuits with magnetically coupled inductors arranged to linearize the low noise amplifiers. And of these low noise amplifiers can be implemented in a receive path in an RF system. The low noise amplifiers can be implemented by any suitable process technology, such as silicon-on-insulator. Any combination of features of the low noise amplifiers of FIGS. 1A to 1D can be implemented as suitable.

FIG. 1A is a schematic diagram of a low noise amplifier (LNA) 10 that includes an impedance transformation circuit according to an embodiment. As illustrated, the LNA 10 includes an impedance transformation circuit and an amplification circuit. The illustrated impedance transformation circuit includes a first inductor 12 and a second inductor 14. The illustrated amplification circuit includes field effect transistors 16 and 18.

The second inductor 14 illustrated in FIG. 1A is a source degeneration inductor that can provide self-inductive degeneration. The first inductor 12 and the second inductor 14 can together provide mutual inductance effects that can improve linearity of the LNA 10. The first inductor 12 and the second inductor 14 can together function as a transformer, with a primary winding in series with a gate of the field effect transistor 16 and a secondary winding electrically connected at the source of the field effect transistor 16. As illustrated, the first inductor 12 is magnetically coupled with the second inductor 14. Accordingly, these inductors can provide negative feedback to linearize the LNA 10. The dot notation in FIG. 1A indicates the phase of magnetic coupling between the first inductor 12 and the second inductor 14.

The amplification circuit illustrated in FIG. 1A includes a common source amplifier 16 and a common gate amplifier 18. An RF input signal RF_IN can be provided to the gate of the common source amplifier 16 by way of the first inductor 12. As illustrated, the common gate amplifier 18 is arranged in series with the common source amplifier 16. Accordingly, the common gate amplifier 18 can be referred to as a cascode transistor or a cascode field effect transistor. A bias circuit can provide a bias signal BIAS to the gate of the common gate amplifier 18. The common gate amplifier 18 can provide an RF output signal RF_OUT.

Figure 1B:
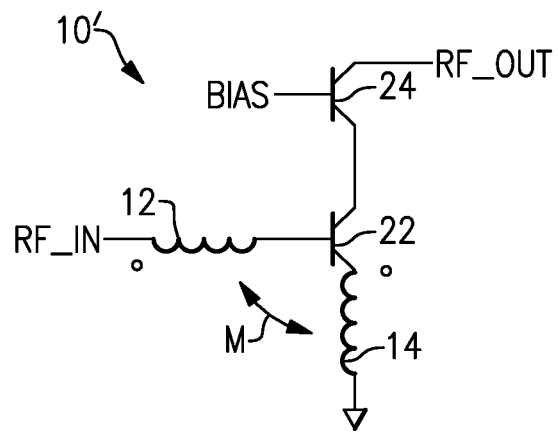
FIG. 1B is a schematic diagram of a low noise amplifier that includes bipolar transistors an impedance transformation circuit according to an embodiment.

FIG. 1B is a schematic diagram of a low noise amplifier 10' that includes an impedance transformation circuit according to an embodiment. The low noise amplifier 10' of FIG. 1B is similar to the low noise amplifier 10 of FIG. 1A, except that the amplification circuit in FIG. 1B is implemented by bipolar transistors instead of field effect transistors. As illustrated in FIG. 1B, the amplification circuit includes bipolar transistors 22 and 24. The amplification circuit of FIG. 1B includes a common emitter amplifier 22 in series with a common base amplifier 24. The second inductor 14 of FIG. 1B is an emitter degeneration inductor.

Figure 1C:
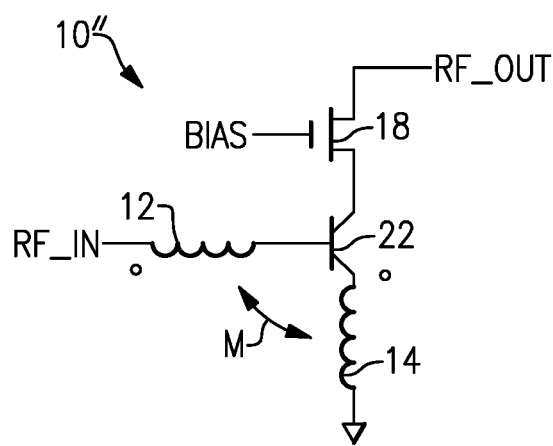
FIG. 1C is a schematic diagram of a low noise amplifier that includes a bipolar transistor, a field effect transistor, and an impedance transformation circuit according to an embodiment.

FIG. 1C is a schematic diagram of a low noise amplifier 10" that includes an impedance transformation circuit according to an embodiment. An amplification circuit of an LNA can include a bipolar transistor and a field effect transistor. The bipolar transistor and the field effect transistor of such an LNA can be arranged in a stack. FIG. 1C illustrates an example of an LNA 10" that includes a bipolar transistor and a field effect transistor arranged in a stack. As illustrated in FIG. 1C, the LNA 10" includes a bipolar transistor 22 arranged as a common emitter amplifier and a cascode filed effect transistor 18 arranged as a common gate amplifier. Alternatively, a low noise amplifier can include a common source amplifier and a common base amplifier arranged in a stack.

Figure 1D:
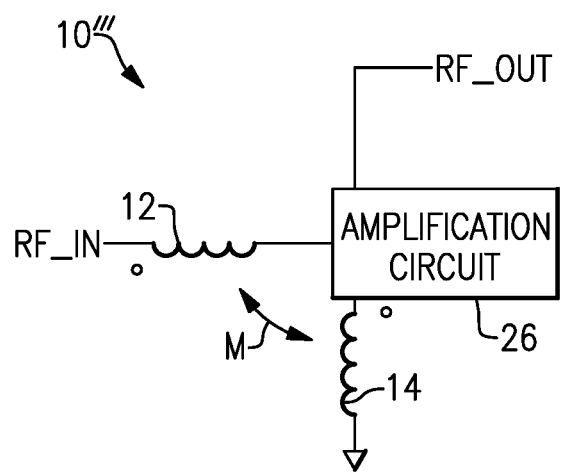
FIG. 1D is a schematic diagram of a low noise amplifier that includes an amplification circuit and an impedance transformation circuit according to an embodiment.

FIG. 1D is a schematic diagram of a low noise amplifier 10''' that includes an impedance transformation circuit according to an embodiment. The amplification circuits shown in FIGS. 1A to 1C are example amplification circuits that can be implemented in connection with an impedance transformation circuit that includes magnetically coupled inductors that provide negative feedback to linearize an LNA. FIG. 1D shows that the first inductor 12 and the second inductor 14 can be implemented in connection with any suitable amplification circuit, as shown by amplification circuit 26. The amplification circuit 26 can be implemented by the amplification circuit of FIG. 1A, the amplification circuit of FIG. 1B, the amplification circuit of FIG. 1C, or any other suitable amplification circuit.

Figure 2A:
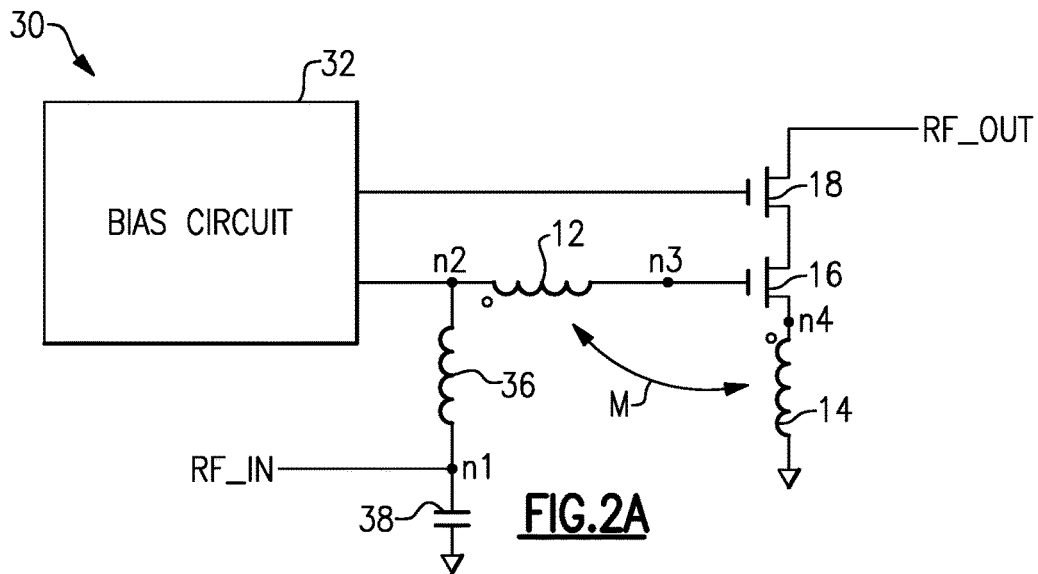
FIG. 2A is a schematic diagram of a low noise amplifier system according to an embodiment.
Figure 2B:
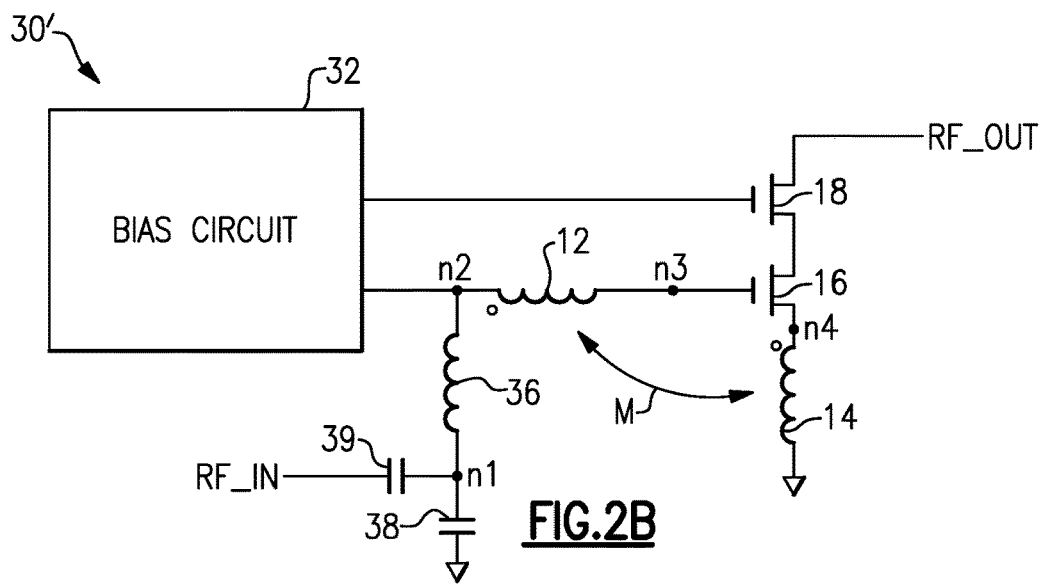
FIG. 2B is a schematic diagram of a low noise amplifier system according to an embodiment.
Figure 2C:
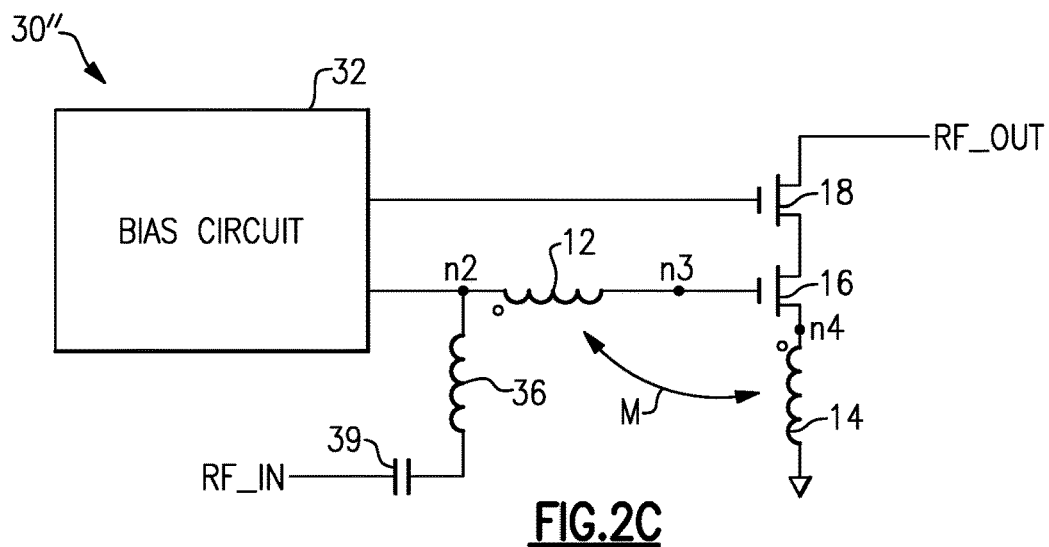
FIG. 2C is a schematic diagram of a low noise amplifier system according to an embodiment.

FIGS. 2A, 2B, and 2C are schematic diagrams of low noise amplifier systems that include low noise amplifiers according to certain embodiments. These LNAs include different input matching circuits. Any of the principles and advantages of these matching circuits can be implemented in connection with any of the amplifiers discussed herein as appropriate.

FIG. 2A is a schematic diagram of a low noise amplifier system 30 that includes an LNA and a bias circuit 32. The LNA illustrated in FIG. 2A includes a matching circuit, an amplification circuit, and a degeneration inductor. The amplification circuit of this LNA corresponds to the amplification circuit of the LNA 10 of FIG. 1A. It will be understood that any of the principles and advantages discussed with reference to FIGS. 2A to 2C can be implemented in connection with other suitable amplification circuits, such as the amplification circuit of the LNA 10' of FIG. 1B and/or the amplification circuit 26 of the LNA 10" of FIG. 1C. In FIG. 2B, the inductors 12 and 14 are magnetically coupled to each other and can function as discussed above.

The matching circuit illustrated in FIG. 2A includes the first inductor 12, a series inductor 36, and a shunt capacitor 38. The matching circuit can provide input impedance matching for the LNA. The RF input signal RF_IN can be provided at node n1. The shunt capacitor 38 is electrically connected to the series inductor 36 at node n1. The shunt capacitor 38 can provide impedance matching at node n1. For instance, the impedance of the shunt capacitor 38 can terminate at a phase corresponding to a fundamental frequency of the RF input signal RF_IN. The RF input signal RF_IN can be provided to the amplification circuit of the LNA by way of the series inductor 36 and the first inductor 12. Magnetic coupling between the first inductor 12 and the second inductor 14 can increase the impedance at node n2. Accordingly, the impedance at node n1 can be increased by this magnetic coupling. Thus, with the increase in impedance from this magnetic coupling, the inductance of the first inductor 12 and/or the inductance of the series inductor 36 can be decreased and provide similar input matching. This can advantageously decrease the physical area of the first inductor 12 and/or the series inductor 36, which can be significant. Inductors with relatively lower inductance can also improve noise performance of the LNA.

The bias circuit 32 can provide a first bias for the common source amplifier 16 at node n2. The first bias can be provided to the gate of the common source amplifier 16 by way of the first inductor 12. In some instances, the bias circuit 32 can provide a second bias to the gate of the common gate amplifier 18. The bias circuit 32 can be implemented by any suitable bias circuit.

The low noise amplifier system 30' of FIG. 2B is similar to the low noise amplifier system 30 of FIG. 2A, except that the matching circuit of the LNA in FIG. 2B also includes a DC blocking capacitor 39. As illustrated, the DC blocking capacitor 39 is coupled between a received RF signal and node n1. The DC blocking capacitor 39 can block DC signal components of the RF input signal RF_IN from being provided to node n1.

The low noise amplifier system 30" of FIG. 2C is similar to the low noise amplifier system 30' of FIG. 2B, except that the matching circuit of the LNA in FIG. 2C does not include the shunt capacitor 38.

Figure 2D:
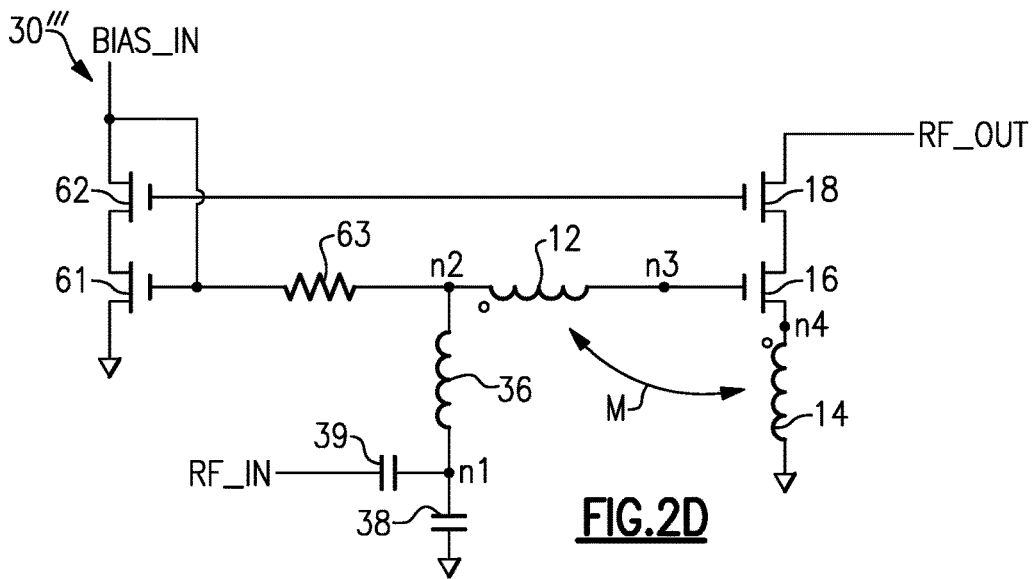
FIG. 2D is a schematic diagram of a low noise amplifier system that includes an illustrative bias circuit according to an embodiment.

FIG. 2D is schematic diagram of low noise amplifier system 30''' that includes an example bias circuit according to an embodiment. The bias circuit of FIG. 2D is an example of the bias circuit 32 of FIGS. 2A to 2C. The bias circuit can include a current mirror to provide a bias signal to an amplification circuit of an LNA. As illustrated in FIG. 2D, the bias circuit includes transistors 61 and 62, and a biasing element 63, such as a resistor. The bias circuit is configured to provide a bias voltage to the transistor 16 by way of the biasing element 63. The biasing input BIAS_IN can be a current provided by a current source.

Figure 2E:
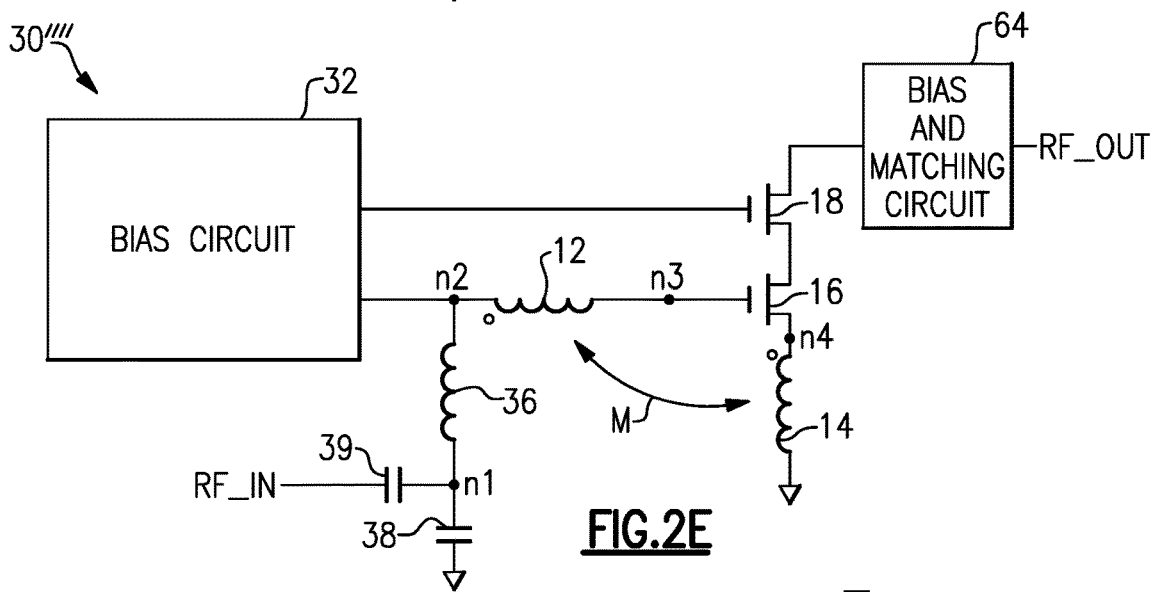
FIG. 2E is a schematic diagram of a low noise amplifier system with a bias and matching circuit according to an embodiment.

FIG. 2E is schematic diagram of low noise amplifier system 30'''' that includes a bias and matching circuit 64 coupled to an output of a low noise amplifier according to an embodiment. The bias and matching circuit 64 can include any suitable circuit elements to bias the output of the LNA and/or to provide impedance matching at the output of the LNA. The bias and matching circuit 64 can be implemented in connection with any of the LNAs discussed herein.

Figure 2F:
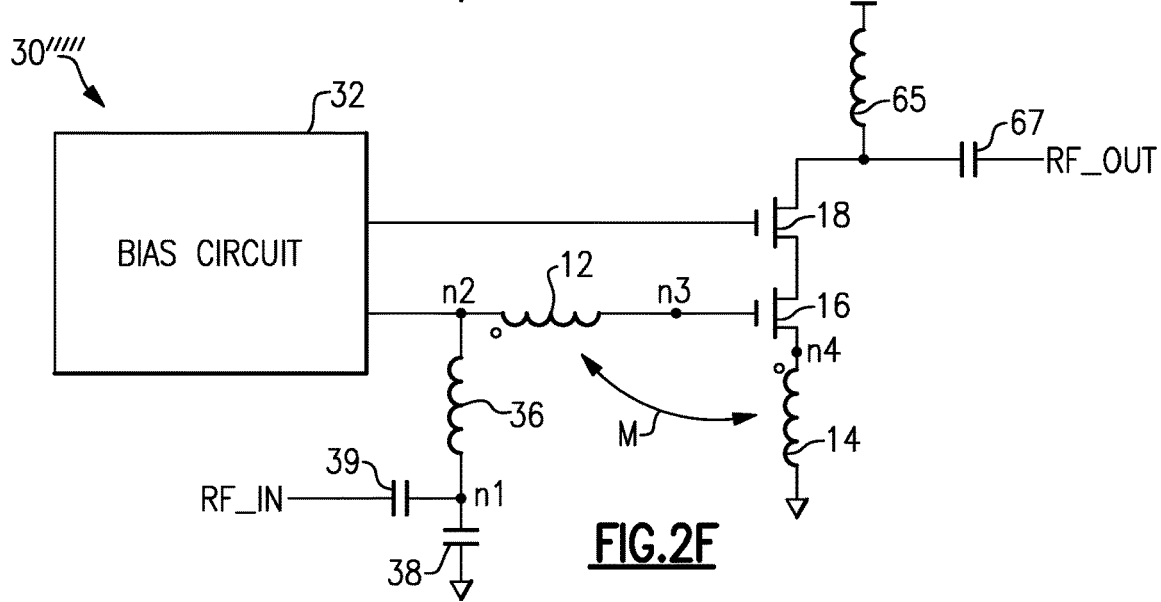
FIG. 2F is a schematic diagram of a low noise amplifier system that includes an illustrative bias and matching circuit according to an embodiment.

FIG. 2F is schematic diagram of low noise amplifier system 30''''' that includes an example bias and matching circuit coupled to an output of a low noise amplifier according to an embodiment. The bias and matching circuit of FIG. 2F is an example of the bias and matching circuit 64 of FIG. 2E. The bias and matching circuit of 2F includes an inductor 65 and a capacitor 67. The inductor 65 can provide a bias to the output of the LNA. The capacitor 67 can provide impedance matching. Other suitable passive impedance networks can alternatively be implemented to provide biasing and impedance matching at the output of the LNA.

Figure 3:
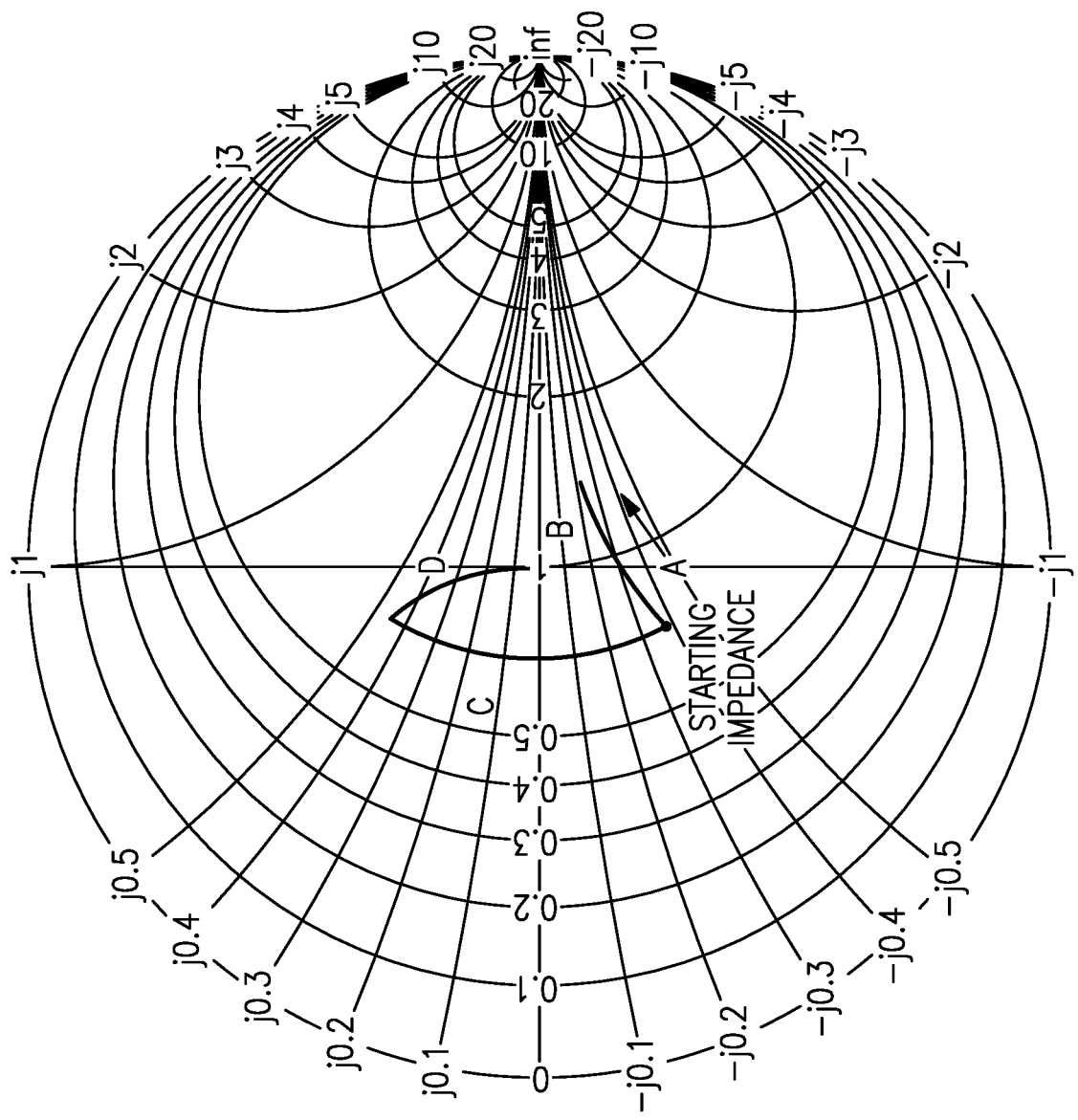
FIG. 3 is a Smith chart corresponding to the passive impedance network of FIG. 2A.

FIG. 3 is a Smith chart corresponding to the matching circuit and the degeneration inductor of the low noise amplifier system of FIG. 2A. This Smith chart shows how the input impedance from the starting impedance varies when the magnetically coupled inductors 12 and 14 are implemented. The arrow on this chart shows the direction for increasing magnetic coupling. Locus A shows how the impedance at node n2 of FIG. 2A varies as the coupling factor is changed between the first inductor 12 and the second inductor 14. Locus A is relatively close to the effect of adding a series resistance. Locus B is the addition of the series inductor 36, from the point where locus A crosses the 50 Ohm resistance line. The net effect is that the series inductor 36 can also be significantly smaller (e.g., in the example shown B=1 nH and C=2.7 nH at 2.5 GHz). Locus C shows the effect of the series inductor 36. Locus D shows the effect of the shunt capacitor 38.

A front end system can include circuits in signal paths between one or more antennas and a baseband system. Some front end systems can include circuits in signal paths between one or more antennas and a mixer configured to modulate a signal to RF or to demodulate an RF signal. Front end systems can process RF signals. Accordingly, front end systems can be referred to as RF front end systems.

FIGS. 4A to 4F are schematic block diagrams of front end systems according to certain embodiments. The front end systems in FIGS. 4A to 4F can be in implemented in a packaged module. The packaged module can be referred to as a front end module. Such packaged modules can include relatively low cost laminate substrate based front end module that combines switch functions with LNAs and/or power amplifiers in certain instances. Some such packaged modules can be multi-chip modules. In certain implementations, one or more of the illustrated components in any of the front end systems in FIGS. 4A to 4F can be embodied on a single die. Such a die can be manufactured using any suitable process technology. As one example, the die can be a semiconductor-on-insulator die, such as a silicon-on-insulator die. According to some implementations, one or more antennas can be integrated with any of the front end systems discussed herein.

Figure 4A:
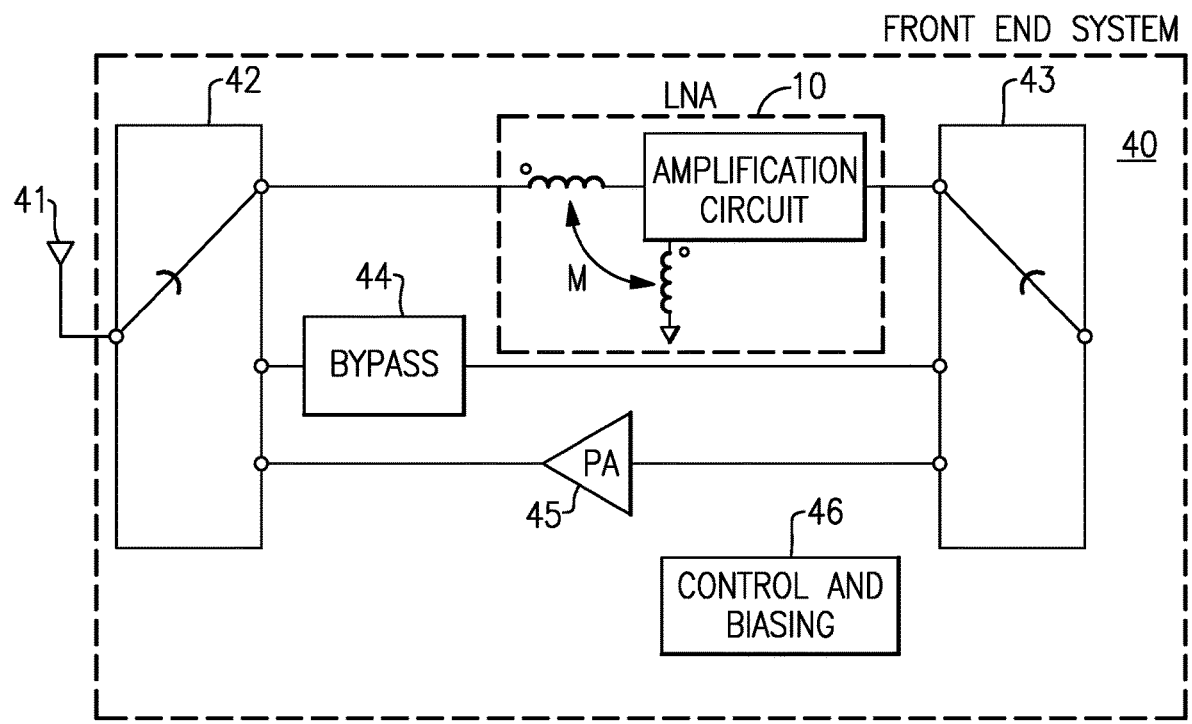
FIG. 4A is a schematic block diagram of front end system that includes a low noise amplifier, a bypass path, a power amplifier, and multi-throw switches according to an embodiment.

FIG. 4A is a schematic block diagram of an RF front end system 40 according to an embodiment. The RF front end system 40 is configured to receive RF signals from an antenna 41 and to transmit RF signals by way of the antenna 41. The illustrated front end system 40 includes a first multi-throw switch 42, a second multi-throw switch 43, a receive signal path that includes an LNA 10, a bypass signal path that includes a bypass network 44, and a transmit signal path that includes a power amplifier 45. The LNA 10 includes an impedance transformation circuit that includes magnetically coupled inductors to provide negative feedback to linearize the LNA 10. The LNA 10 can include any of the principles and advantages of any of the LNAs discussed herein. The bypass network 44 can include any suitable network for matching and/or bypassing the receive signal path and the transmit signal path. The bypass network 44 can be implemented by a passive impedance network or by a conductive trace or wire. The power amplifier 45 can be implemented by any suitable power amplifier configured to amplify am RF signal for transmission via the antenna 41.

The first multi-throw switch 42 can selectively electrically connect a particular signal path to the antenna 41. The first multi-throw switch 42 can electrically connect the receive signal path to the antenna 41 in a first state, electrically connect the bypass signal path to the antenna 41 in a second state, and electrically connect the transmit signal to the antenna 41 in a third state. The second multi-throw switch 43 can selectively electrically connect a particular signal path to an input/output port of the front end system 40, in which the particular signal path is the same signal path electrically connected to the antenna 41 by way of the first multi-throw switch 42. Accordingly, second multi-throw switch 43 together with the first multi-throw switch 42 can provide signal path between the antenna 41 and the input/output port of the front end system 40.

The control and biasing block 46 can provide any suitable biasing and control signals to the front end system 40. For example, the control and biasing block 46 can provide bias signals to the LNA 10 and/or the PA 45. Alternatively or additionally, the control and biasing block 46 can also provide control signals to the multi-throw switches 42 and 43.

Figure 4B:
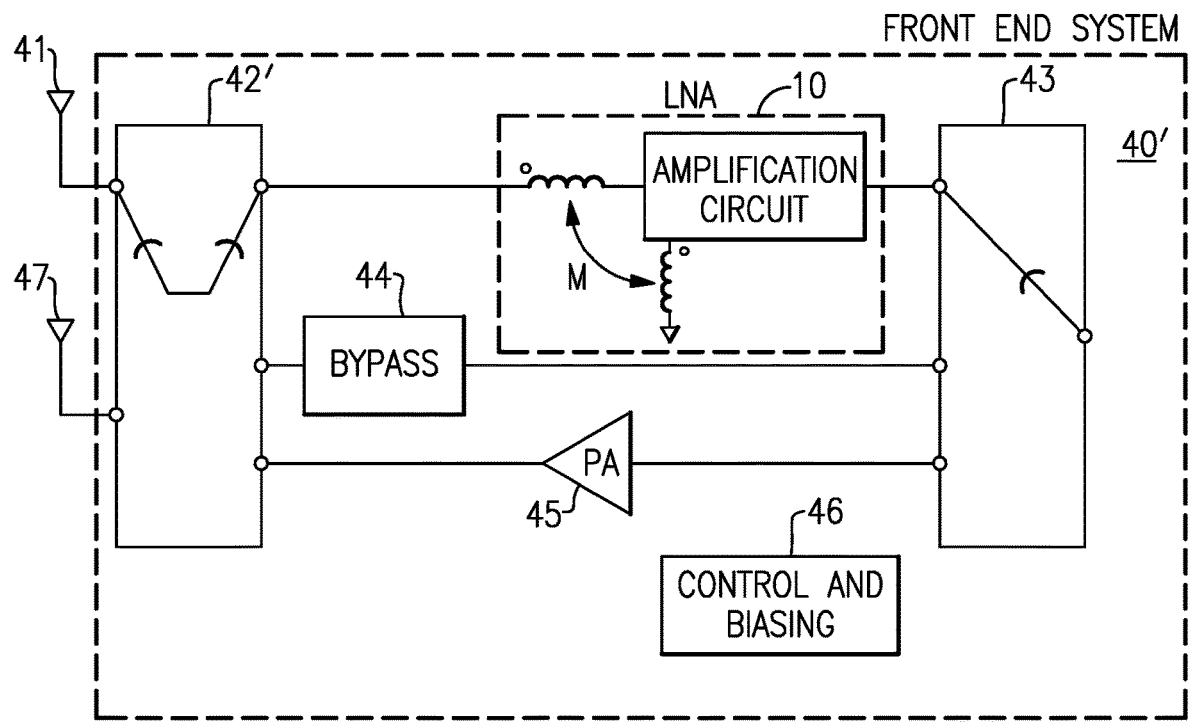
FIG. 4B is a schematic block diagram of front end system that includes a plurality of antenna ports according to an embodiment.

FIG. 4B is a schematic block diagram of an RF front end system 40' according to an embodiment. The RF front end system 40' of FIG. 4B is similar to the RF front end system 40 of FIG. 4A, except the multi-throw switch 42' is configured to selectively electrically connect a particular signal path to either a first antenna 41 or a second antenna 47. The multi-throw switch 42' can be a multi-throw, multi-pole switch.

Figure 4C:
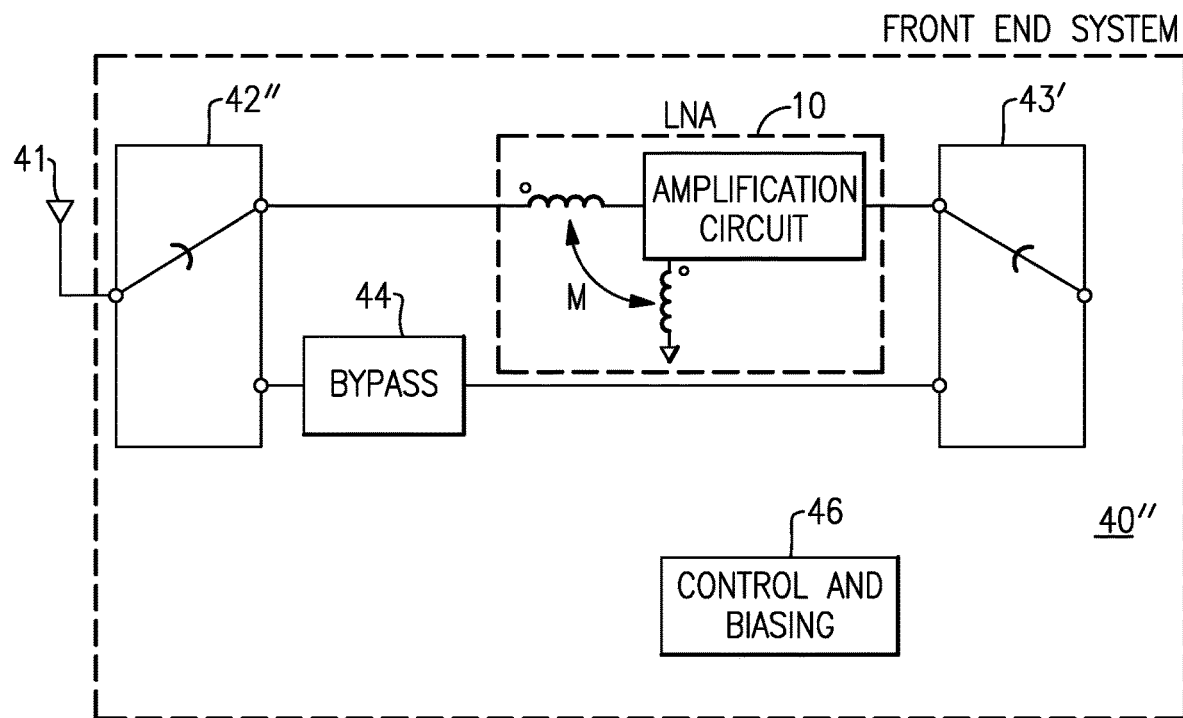
FIG. 4C is a schematic block diagram of front end system that includes a bypass path and low noise amplifier according to an embodiment.

FIG. 4C is a schematic block diagram of an RF front end system 40'' according to an embodiment. The RF front end system 40'' of FIG. 4C is similar to the RF front end system 40 of FIG. 4A, except that a transmit signal path is omitted and the multi-throw switches 42'' and 43' each have one fewer throw. The illustrated front end system 40'' includes a receive signal path and a bypass signal path and does not include a transmit signal path.

Figure 4D:
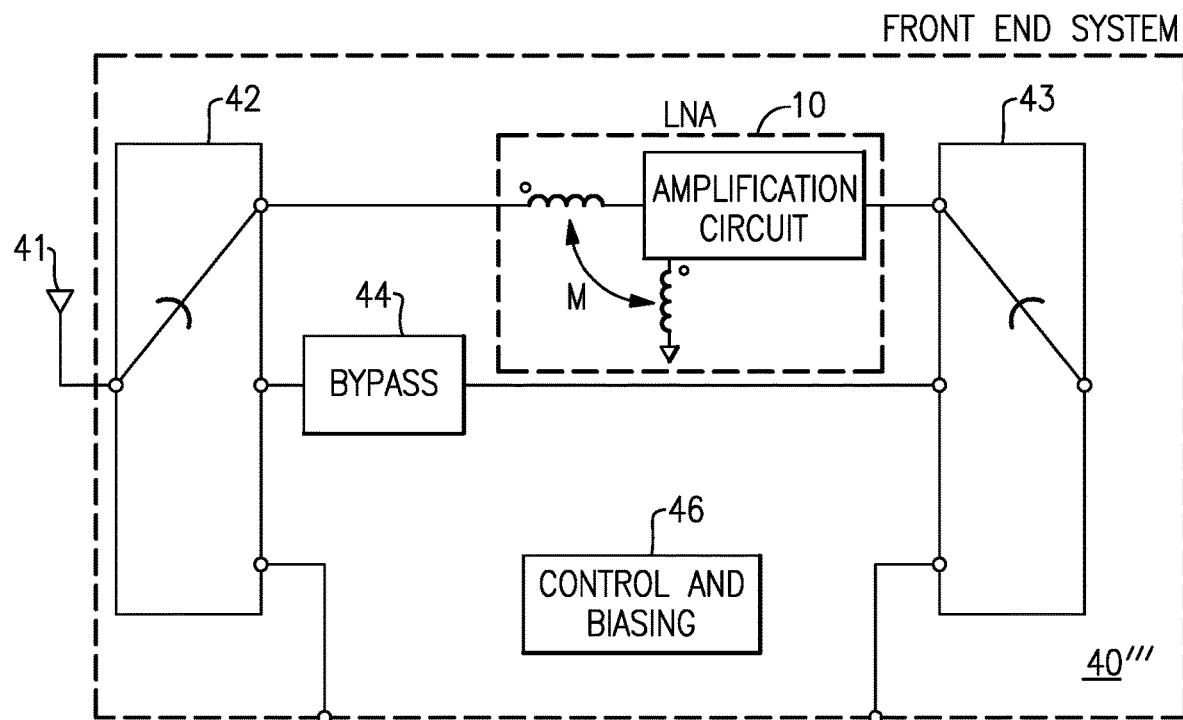
FIG. 4D is a schematic block diagram of front end system that includes a bypass path, ports connectable to a radio frequency signal path such as a transmit path, and low noise amplifier according to an embodiment.

FIG. 4D is a schematic block diagram of an RF front end system 40''' according to an embodiment. The RF front end system 40''' of FIG. 4D is like the RF front end system 40 of FIG. 4A, except that a power amplifier of the transmit signal path is omitted from the RF front end system 40'''. The RF front end system 40''' includes input/output ports for coupling to throws of the multi-throw switches 42 and 43. A power amplifier external to the front end system 40''' can be electrically connected between these input/output ports such that the power amplifier is included in the transmit signal path between the multi-throw switches 42 and 43. The power amplifier can be included in a different packaged module and/or embodied on a different die that the any or all of the illustrated elements of the RF front end system 40'''.

Figure 4E:
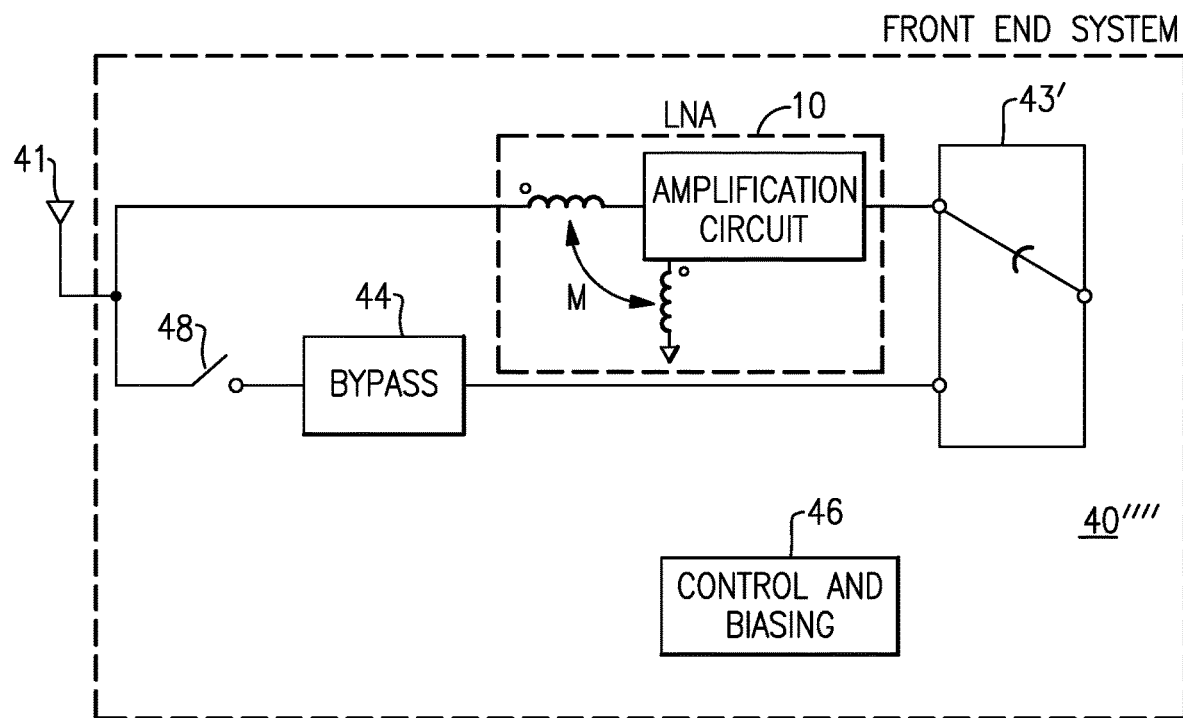
FIG. 4E is a schematic block diagram of front end system with an antenna port coupled to a switch and a low noise amplifier according to an embodiment.

FIG. 4E is a schematic block diagram of an RF front end system 40'''' according to an embodiment. The RF front end system 40'''' of FIG. 4E is like the RF front end system 40'' of FIG. 4C, except that an antenna port of the RF front end system 40'''' of FIG. 4E is connected to both the LNA 10 and a switch 48. The switch 48 can selectively electrically connect the antenna port to the bypass path 44. As illustrated, the switch 48 is a single through switch. FIG. 4E illustrates that a front end module can be implemented without a multi-throw switch coupled between an antenna port and an LNA. When the switch 48 is connecting the antenna port to the bypass path 44, an enable signal provided to the LNA 10 can be de-asserted to turn off the LNA 10. This can deactivate the LNA 10 without decoupling an input of the LNA 10 from the antenna port. Without a switch coupled between an input of the LNA 10 and the antenna port, insertion loss in the LNA path can be reduced. The control and biasing circuit 46 can provide the enable signal for the LNA 10 and/or control the switch 48.

Figure 4F:
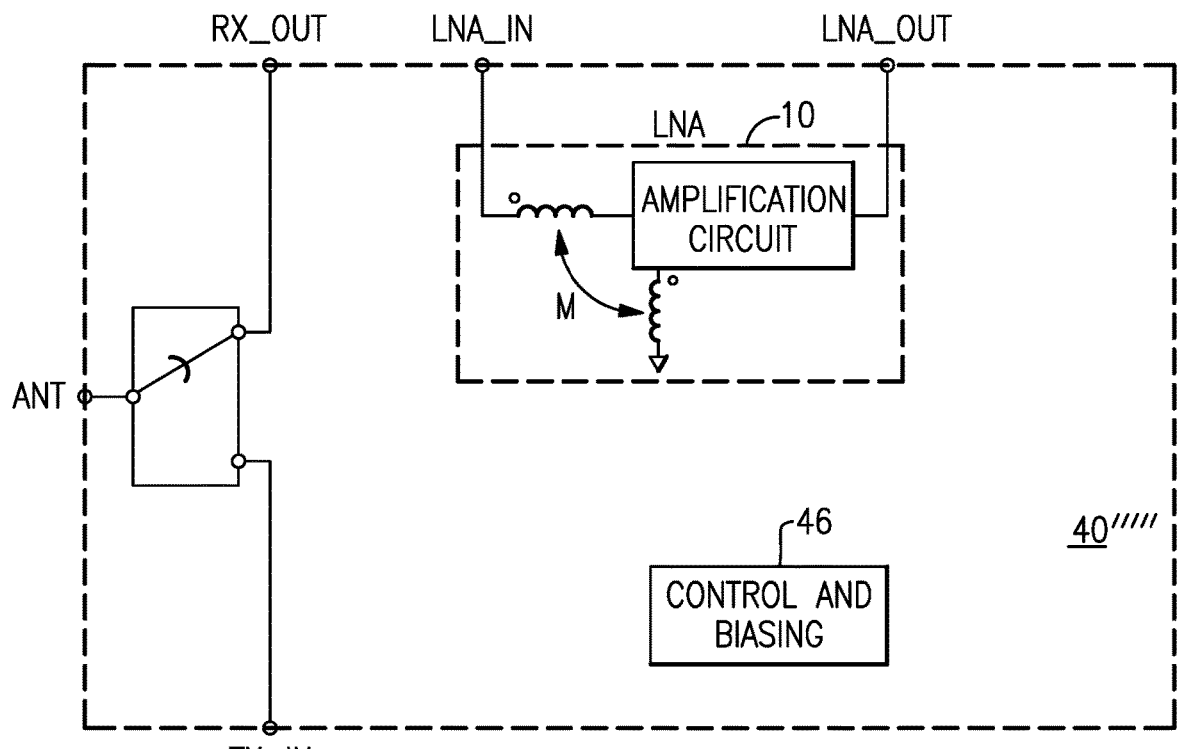
FIG. 4F is a schematic block diagram of front end system according to another embodiment.

FIG. 4F is a schematic block diagram of an RF front end system 40''''' according to an embodiment. The RF front end system 40''''' includes a receive output port RX_OUT and a transmit input port TX_IN to connect with circuitry implemented outside of a front end module. As shown in FIG. 4F, the LNA 10 can have an input connected to an LNA input port LNA_IN and/or and output connected to an LNA output port LNA_OUT of the front end module. This can enable additional circuitry, such as a filter and/or an impedance matching circuit, to be implemented external to the front end module. FIG. 4F also illustrates that the multi-throw switch 43 and/or 43' can be implemented external to a front end module that includes the LNA 10.

Figure 4G:
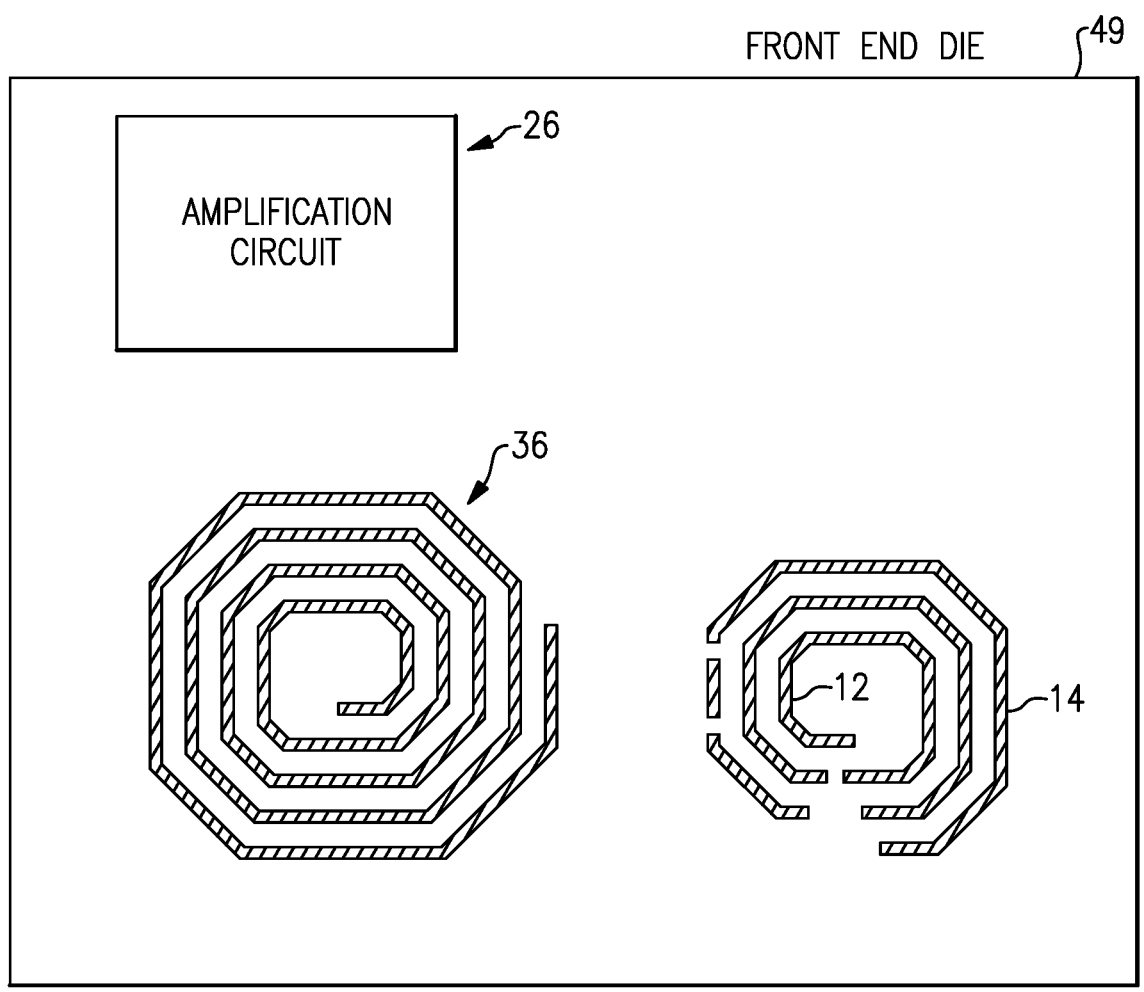
FIG. 4G illustrates a physical layout of magnetically coupled inductors of a low noise amplifier according to an embodiment.

Some or all of the circuit elements of the LNAs and/or front end systems discussed above can be implemented on a single semiconductor die. FIG. 4G illustrates a physical layout of magnetically coupled inductors of a low noise amplifier according to an embodiment. As illustrated, a die 49 includes an amplification circuit 26, a first inductor 12, and a second inductor 14 that is magnetically coupled with the first inductor 12. The die 49 can also include a series inductor 36, as illustrated. The die 49 can be manufactured using any suitable process technology. As one example, the die 49 can be a semiconductor-on-insulator die, such as a silicon-on-insulator die.

The first inductor 12 and the second inductor 14 can each include one or more annular turns. The first inductor 12 and the second inductor 14 can be interleaved with each other. In some instances, the first inductor 12 and/or the second inductor 14 can be implemented in two metal layers with conductive connections between metals in the two metal layers. This can lower resistance of the metal and increase the quality factor of an inductor.

The first inductor 12 and the second inductor can be wound around a magnetic core in some instances. Alternatively, a magnetic core can be implemented around the first inductor 12 and the second inductor 14 in certain applications.

While FIG. 4G is not necessarily to scale, this drawing illustrates that the first inductor 12 and the second inductor 14 can be relatively large and can consume significant physical die area. As also illustrated, the series inductor 36 can be relatively large and can consume significant physical die area. Accordingly, reducing the inductance and thus the size of the first inductor 12 (and/or the series inductor 36 described above) can result in a significant reduction in physical area consumed by an LNA.

Figure 5A:
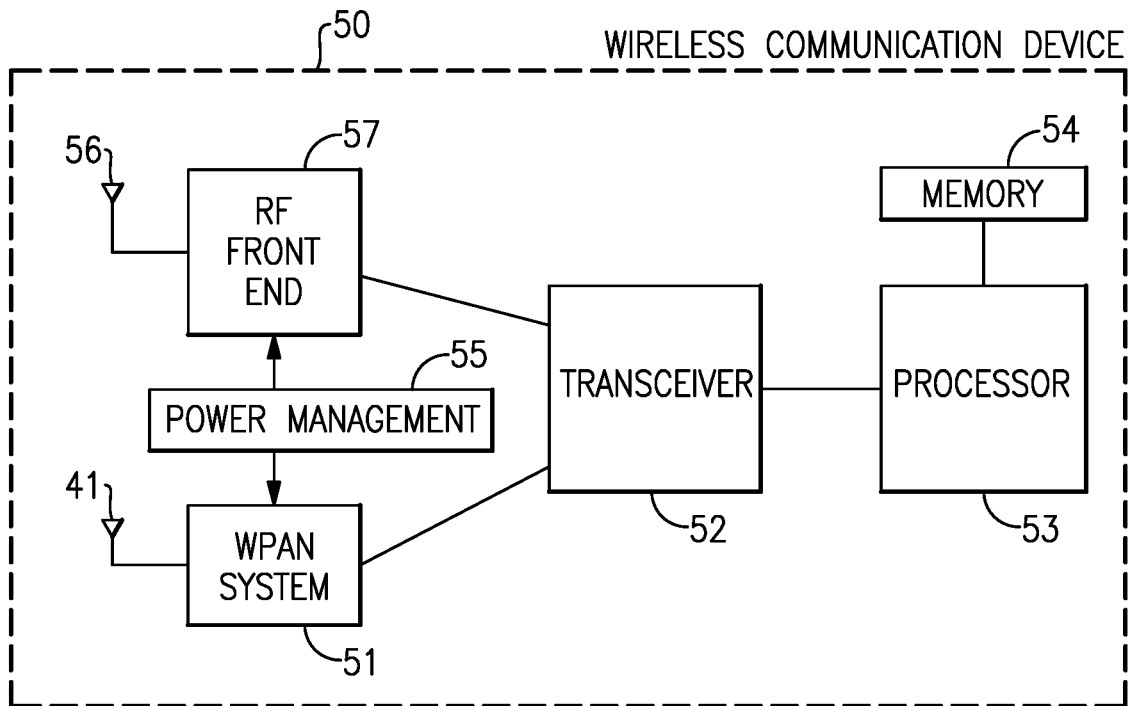
FIGS. 5A and 5B are schematic block diagrams of illustrative wireless communication devices that include low noise amplifiers and/or front end systems in accordance with certain embodiments.
Figure 5B:
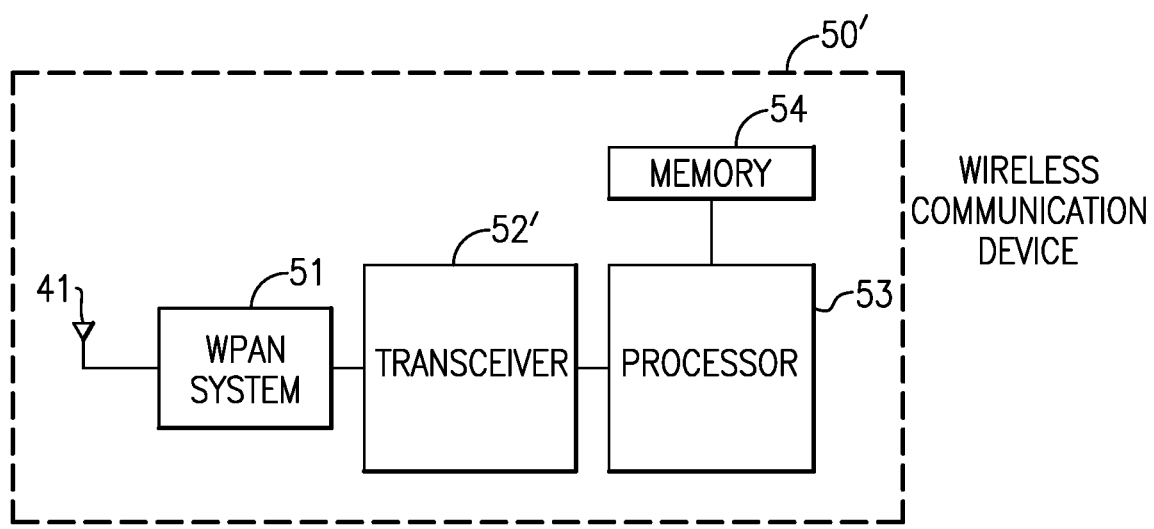

FIGS. 5A and 5B are schematic block diagrams of illustrative wireless communication devices that include a low noise amplifier and/or a front end system in accordance with one or more embodiments. The wireless communication device 50 can be any suitable wireless communication device. For instance, the wireless communication device can be a mobile phone such as a smart phone.

FIG. 5A is a schematic diagram of a wireless communication device 50 according to an embodiment. As illustrated, the wireless communication device 50 includes a first antenna 41, a wireless personal area network (WPAN) system 51, a transceiver 52, a processor 53, a memory 54, a power management block 55, a second antenna 56, and an RF front end system 57. Any of the LNAs and/or impedance transformation circuits discussed herein can be implemented in the WPAN system 51 and/or the RF front end system 57. The WPAN system 51 is an RF front end system configured for processing RF signals associated with personal area networks (PANs). The WPAN system 51 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless local area network (WLAN) system can be in place of the illustrated WPAN system, and the WLAN system can process wireless local area network signals, such as Wi-Fi signals.

FIG. 5B is a schematic diagram of a wireless communication device 50' according to another embodiment. The illustrated wireless communication device 50' of FIG. 5B is a device configured to communicate over a PAN. This wireless communication device can be relatively less complex than the wireless communication device 50 of FIG. 5A. As illustrated, the wireless communication device 50' includes an antenna 41, a WPAN system 51, a transceiver 52', a processor 53, and a memory 54. The WPAN system 51 can include LNAs and/or impedance transformation circuits in accordance with any of the principles and advantages discussed herein. In another embodiment, a wireless local area network (WLAN) system can be implemented in place of the illustrated WPAN system 51, and the WLAN system can process WLAN signals such as Wi-Fi signals.

Any of the principles and advantages discussed herein can be applied to other systems, not just to the systems described above. The elements and operations of the various embodiments described above can be combined to provide further embodiments. Some of the embodiments described above have provided examples in connection with low noise amplifiers, front end modules and/or wireless communications devices. However, the principles and advantages of the embodiments can be used in association with any other systems, apparatus, or methods that could benefit from any of the teachings herein. For instance, any of the impedance transformation circuits discussed can be implemented in any amplifier that could benefit from enhanced linearity. Any of the principles and advantages of the embodiments discussed can be used in any other systems or apparatus that could benefit from an amplifier with enhanced linearity. Any of the principles and advantages discussed herein can be implemented in RF circuits configured to process signals having a frequency in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, wireless communication devices, personal area network communication devices, uplink cellular devices, wireless communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including," and the like are generally to be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected to each other, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. The word "or" in reference to a list of two or more items is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel methods, apparatus, and systems described herein may be embodied in a variety of other forms; furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A radio frequency device comprising:
  a first inductor that receives a radio frequency signal and a second inductor in series with the first inductor, the second inductor implemented in a first metal layer of a semiconductor die;
  an amplification circuit in communication with the second inductor, the amplification circuit amplifies the radio frequency signal; and
  a third inductor magnetically coupled to at least the second inductor to provide negative feedback to linearize the amplification circuit, the third inductor implemented in a second metal layer of the semiconductor die, and the second metal layer is conductively connected to the first metal layer.

2. The radio frequency device of claim 1 wherein the first, second and third inductors are on a common semiconductor-on-insulator die.

3. The radio frequency device of claim 1 further comprising a bias circuit configured to provide a bias signal to the amplification circuit at a node between the first and second inductors.

4. The radio frequency device of claim 3 wherein the amplification circuit includes a first transistor and a cascode transistor arranged in series with the first transistor, the first transistor configured to receive the bias signal by way of the second inductor to thereby bias to the first transistor, and the cascode transistor configured to receive a second bias signal from the bias circuit to thereby bias the cascode transistor.

5. The radio frequency device of claim 1 wherein the second inductor and the third inductor are interleaved with each other in physical layout.

6. The radio frequency device of claim 1 further including a direct current blocking capacitor in communication with the first inductor, the direct current blocking capacitor provides the radio frequency signal to the amplification circuit by way of the first inductor.

7. The radio frequency device of claim 1 wherein the third inductor is electrically connected between a terminal of a transistor of the amplification circuit and ground.

8. The radio frequency device of claim 1 wherein the amplification circuit includes a common source amplifier and a cascode transistor arranged in series with the common source amplifier.

9. The radio frequency device of claim 1 wherein the amplification circuit includes a common emitter amplifier and a cascode transistor arranged in series with the common emitter amplifier.

10. The radio frequency device of claim 1 wherein the second and third inductors are wound around a common magnetic core.

11. The radio frequency device of claim 1 wherein the amplification circuit includes a common source amplifier, and the second inductor is a source degeneration inductor.

12. A method of radio frequency signal amplification, the method comprising:
receiving a radio frequency signal at a first inductor, the first inductor in series with a second inductor that is implemented in a first metal layer of a semiconductor die;
amplifying the radio frequency signal with an amplification circuit; and
providing negative feedback to linearize the amplification circuit with a third inductor magnetically coupled to the second inductor, the third inductor implemented in a second metal layer of the semiconductor die, and the second metal layer is conductively connected to the first metal layer.

13. The method of claim 12 wherein the first inductor is non-concentric with the second inductor in physical layout.

14. The method of claim 12 wherein the first inductor, the second inductor, the third inductor, and the amplification circuit are on a single semiconductor-on-insulator die.

15. The method of claim 12 further comprising biasing a transistor of the amplification circuit with a bias signal coupled between the first and second inductors.

16. The method of claim 15 further comprising biasing a cascode transistor of the amplification circuit with a second bias signal, the cascode transistor arranged in series with the transistor.

17. The method of claim 12 further comprising interleaving the second inductor and the third inductor in physical layout.

18. A semiconductor die for a front end system, the semiconductor die comprising:
a first inductor;
a second inductor arranged in series with the first inductor, the second inductor implemented in a first metal layer of the semiconductor die;
an amplification circuit that receives a radio frequency signal by way of the first inductor and second inductors, the amplification circuit configured to amplify the radio frequency signal; and
a third inductor magnetically coupled to the second inductor to provide negative feedback to linearize the amplification circuit, the third inductor implemented in a second metal layer of the semiconductor die, the second metal layer is conductively connected to the first metal layer, and the semiconductor die is a single semiconductor-on-insulator die.

19. The semiconductor die of claim 18 wherein the single semiconductor-on-insulator die is a silicon-on-insulator die.

20. The semiconductor die of claim 18 wherein the first inductor is non-concentric with the second inductor in physical layout.

* * * * *